United States Patent
Otsuka

(10) Patent No.: US 9,019,755 B2
(45) Date of Patent: Apr. 28, 2015

(54) MEMORY UNIT AND METHOD OF OPERATING THE SAME

(75) Inventor: Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 490 days.

(21) Appl. No.: 13/337,969

(22) Filed: Dec. 27, 2011

(65) Prior Publication Data

US 2012/0182785 A1    Jul. 19, 2012

(30) Foreign Application Priority Data

Jan. 13, 2011    (JP) ................... 2011-004830

(51) Int. Cl.
*G11C 13/00* (2006.01)
*B65D 71/14* (2006.01)
*B65D 71/12* (2006.01)

(52) U.S. Cl.
CPC ............. *B65D 71/14* (2013.01); *B65D 71/125* (2013.01); *B65D 2571/00907* (2013.01); *G11C 13/0004* (2013.01); *G11C 13/0007* (2013.01); *G11C 13/0011* (2013.01); *G11C 13/003* (2013.01); *G11C 13/0061* (2013.01); *G11C 13/0069* (2013.01); *G11C 2013/0071* (2013.01); *G11C 2013/0073* (2013.01); *G11C 2213/15* (2013.01); *G11C 2213/56* (2013.01); *G11C 2213/74* (2013.01); *G11C 2216/24* (2013.01)

(58) Field of Classification Search
CPC ........... G11C 13/0002; G11C 13/0021; G11C 13/0069
USPC ............................. 365/148, 158, 163, 189.16
See application file for complete search history.

(56) References Cited

U.S. PATENT DOCUMENTS

| | | | |
|---|---|---|---|
| 7,242,606 B2 | 7/2007 | Hachino et al. | |
| 8,058,636 B2 | 11/2011 | Osano et al. | |
| 8,482,956 B2 | 7/2013 | Yamazaki et al. | |
| 2003/0026134 A1* | 2/2003 | Lowrey | 365/185.24 |
| 2004/0257864 A1* | 12/2004 | Tamai et al. | 365/158 |
| 2006/0279983 A1* | 12/2006 | Hachino et al. | 365/158 |
| 2007/0008786 A1* | 1/2007 | Scheuerlein | 365/189.01 |

(Continued)

FOREIGN PATENT DOCUMENTS

| | | |
|---|---|---|
| JP | 2006-099866 A | 4/2006 |
| JP | 2006-196537 A | 7/2006 |
| JP | 2012-038408 A | 2/2012 |
| WO | WO-2008/126365 A1 | 10/2008 |

OTHER PUBLICATIONS

Japanese Office Action issued Apr. 30, 2014 for corresponding Japanese Application No. 2011-004830.

*Primary Examiner* — Douglas King
(74) *Attorney, Agent, or Firm* — Rader, Fishman & Grauer PLLC

(57) ABSTRACT

A memory unit includes memory cells each having a memory element and a transistor, word lines and first and second bit lines, and a drive section. In performing setting operation for a first memory element located on one word line and in performing resetting operation for a second memory element located on the one word line, the drive section applies a given word line electric potential to the one word line, and sets an electric potential of a bit line on a lower electric potential side out of the first and the second bit lines corresponding to the first memory element to a value higher than a value of an electric potential of a bit line on the lower electric potential side corresponding to the second memory element by an amount of given electric potential difference.

20 Claims, 17 Drawing Sheets

(56) References Cited

U.S. PATENT DOCUMENTS

| | | | |
|---|---|---|---|
| 2007/0025144 A1* | 2/2007 | Hsu et al. | 365/163 |
| 2008/0083918 A1* | 4/2008 | Aratani et al. | 257/5 |
| 2009/0129195 A1* | 5/2009 | De Brosse et al. | 365/230.06 |
| 2010/0265757 A1* | 10/2010 | Otsuka | 365/148 |
| 2012/0320665 A1* | 12/2012 | Ueda et al. | 365/158 |

* cited by examiner

IN SETTING OPERATION
(FROM HIGH RESISTANCE STATE TO LOW RESISTANCE STATE)

IN RESETTING OPERATION
(FROM LOW RESISTANCE STATE TO HIGH RESISTANCE STATE)

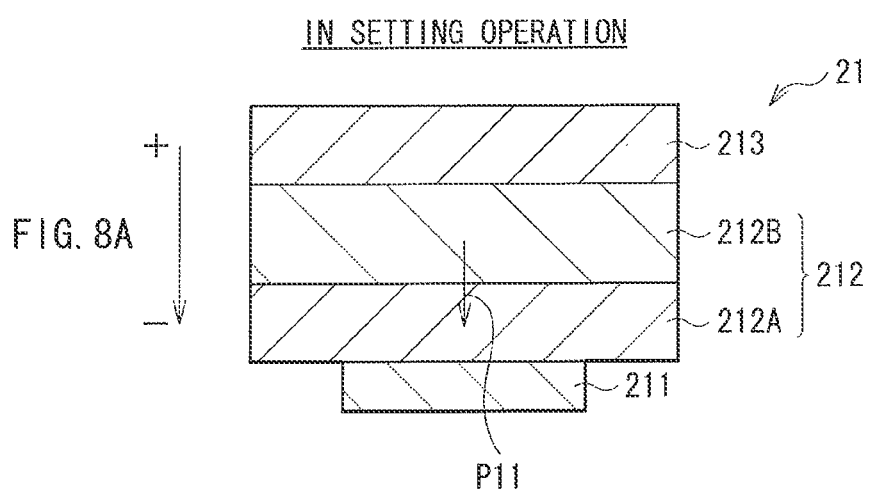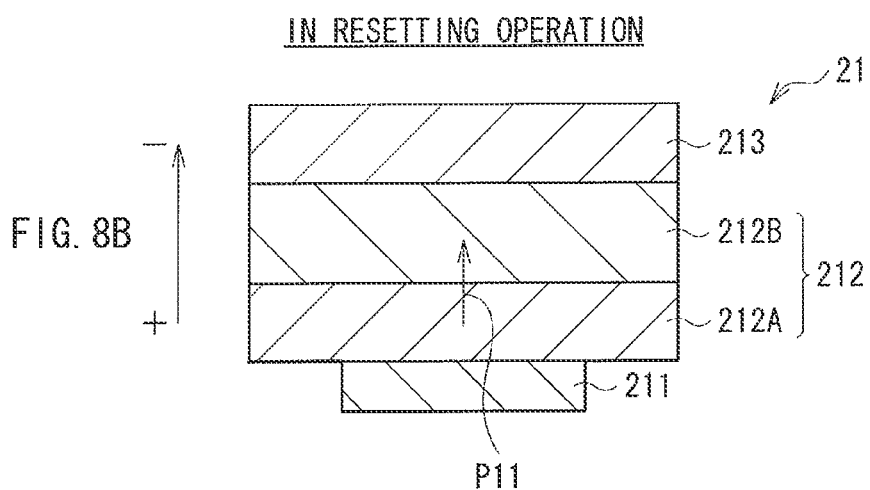

SETTING OPERATION

RESETTING OPERATION

MEMORY UNIT AND METHOD OF OPERATING THE SAME

BACKGROUND

The present disclosure relates to a memory unit that includes a memory element storing information by change of electric characteristics of a memory layer and a method of operating the memory unit.

In information apparatuses such as a computer, a DRAM (Dynamic Random Access Memory) with a high-speed operation and high density is widely used as a random access memory. However, in the DRAM, the manufacturing cost is high since the manufacturing process is more complicated than that of a general logical circuit LSI (Large Scale Integrated Circuit) and a general signal processor used for electronic apparatuses. Further, since the DRAM is a volatile memory in which information is not retained if the power is turned off, it is necessary to perform refresh operation frequently, that is, it is necessary to read out written information (data), amplify the information again, and rewrite the information.

Meanwhile, in recent years, a so-called bipolar type resistance random access memory that records low resistance state and high resistance state according to current direction has been developed. Further, a so-called 1T1R type (including one memory element for one transistor) nonvolatile memory cell composed of combination of such a bipolar type resistance random access memory and a selection transistor has been proposed as well. For example, in Japanese Unexamined Patent Application Publication No. 2006-196537, a new type resistance random access memory particularly advantageous to microfabrication limit of memory elements is proposed.

SUMMARY

The resistance random access memory of Japanese Unexamined Patent Application Publication No. 2006-196537 has a structure in which an ion conductor (memory layer) containing a metal is sandwiched between two electrodes. In the resistance random access memory, the metal contained in the ion conductor is contained in one of the two electrodes. Thereby, in the case where a voltage is applied between the two electrodes, the metal contained in the electrode is diffused as ions in the ion conductor, and a resistance value of the ion conductor or electric characteristics of a capacitance or the like are changed.

It is known that in the foregoing bipolar type resistance random access memory, in general, in the case where a current at the same level as a current flown in operation (setting operation) to change resistant state of the memory from high resistance state to low resistance state is flown in the reverse direction, operation (resetting operation) to change resistant state of the memory from low resistance state to high resistance state is made. Due to such characteristics, in a memory unit (nonvolatile memory array) in which the foregoing 1T1R type nonvolatile memory cells are arrayed, a value of a voltage (word line electric potential) applied to a gate (word line) of a transistor at the time of setting operation is different from a value thereof at the time of resetting operation.

Thus, in the existing nonvolatile memory array (memory unit), it is not possible to execute setting operation and resetting operation at the same time (concurrently) for given (a plurality of) memory cells located on the same word line. In result, it is necessary to allocate setting operation time period and resetting operation time period separately on the same word line, resulting in difficulty to improve operation speed of the memory unit.

In view of the foregoing disadvantage, in the present disclosure, it is desirable to provide a memory unit capable of improving operation speed and a method of operating the memory unit.

According to an embodiment of the present disclosure, there is provided a first memory unit including: a plurality of memory cells that respectively have a memory element in which resistance state is reversibly changed according to polarity of an applied voltage and a transistor for selecting a memory element as a drive target; a plurality of word lines and a plurality of first and second bit lines connected to the plurality of memory cells; and a drive section that selectively changes resistance state of the memory element as the drive target between low resistance state and high resistance state by applying a given electric potential to the word line and the first and the second bit lines. In performing setting operation to change resistance state from the high resistance state to the low resistance state for a first memory element located on one word line and in performing resetting operation to change resistance state from the low resistance state to the high resistance state for a second memory element located on the one word line, the drive section applies a given word line electric potential to the one word line, and sets an electric potential of a bit line on a lower electric potential side out of the first and the second bit lines corresponding to the first memory element to a value higher than a value of an electric potential of a bit line on the lower electric potential side corresponding to the second memory element by an amount of given electric potential difference.

According to an embodiment of the present disclosure, there is provided a method of operating the first memory unit, wherein in operating a memory unit including a plurality of memory cells that respectively have a memory element in which resistance state is reversibly changed according to polarity of an applied voltage and a transistor for selecting a memory element as a drive target and a plurality of word lines and a plurality of first and second bit lines connected to the plurality of memory cells, a given word line electric potential is applied to one word line, while an electric potential of a bit line on a lower electric potential side out of the first and the second bit lines corresponding to a first memory element located on one word line is set to a higher value than an electric potential of a bit line on the lower electric potential side corresponding to a second memory element located on the one word line by an amount of given electric potential difference, a given voltage is applied between the first and the second bit lines, and thereby setting operation to change resistance state from high resistance state to low resistance state is performed for the first memory element, and resetting operation to change resistance state from the low resistance state to the high resistance state is performed for the second memory element.

In the first memory unit according to the embodiment of the present disclosure and the method of operating the first memory unit according to the embodiment of the present disclosure, a given electric potential is applied to the word line and the first and the second bit lines, and thereby resistance state of the memory element as the drive target is selectively changed between low resistance state and high resistance state. In performing setting operation (operation to change resistance state from the high resistance state to the low resistance state) for the first memory element located on one word line and in performing resetting operation (operation to change resistance state from the low resistance state to the high resistance state) for the second memory element located on the one word line, a given word line electric potential is applied to the one word line, and the electric potential of the bit line on the lower electric potential side out of the first and the second bit lines corresponding to the first memory element is set to a value higher than the value of the electric potential of the bit line on the lower electric potential side corresponding to the second memory element by an amount of the given electric potential difference. Thereby, a voltage applied to the one word line (the foregoing word line electric potential) is commoditized (commonly used) for the time of setting operation (on the first memory element side) and the time of resetting operation (on the second memory element side). In result, it becomes possible to execute setting operation and resetting operation at the same time (concurrently) for given (a plurality of) memory cells located on the same word line.

It is a definition issue whether writing operation/erasing operation for the memory element correspond to decreasing resistance (change from high resistance state to low resistance state) or increasing resistance (change from low resistance state to high resistance state). In this specification, low resistance state is defined as writing state, and high resistance state is defined as erasing state.

According to an embodiment of the present disclosure, there is provided a second memory unit including: a plurality of memory cells that respectively have a memory element in which resistance state is reversibly changed according to polarity of an applied voltage and a transistor for selecting a memory element as a drive target; a plurality of resistance elements indicating a fixed resistance value; a plurality of word lines and a plurality of first and second bit lines connected to the plurality of memory cells; and a drive section that selectively changes resistance state of the memory element as the drive target between low resistance state and high resistance state by applying a given electric potential to the word line and the first and the second bit lines. In the memory cell, the word line is connected to a gate of the transistor, the first bit line is connected to one of a source and a drain in the transistor with the resistance element in between, and the second bit line is connected to the other one of the source and the drain in the transistor with the memory element in between.

According to an embodiment of the present disclosure, there is provided a method of operating the second memory unit, wherein in operating a memory unit that includes a plurality of memory cells respectively having a memory element in which resistance state is reversibly changed according to polarity of an applied voltage and a transistor for selecting a memory element as a drive target, a plurality of resistance elements indicating a fixed resistance value, and a plurality of word lines and a plurality of first and second bit lines connected to the plurality of memory cells, in which in the memory cell, the word line is connected to a gate of the transistor, the first bit line is connected to one of a source and a drain in the transistor with the resistance element in between, and the second bit line is connected to the other one of the source and the drain in the transistor with the memory element in between, a given word line electric potential is applied to one word line, while an electric potential of a bit line on a lower electric potential side out of the first and the second bit lines corresponding to a first memory element located on the one word line is set to a value equal to that of an electric potential of a bit line on the lower electric potential side corresponding to a second memory element located on the one word line, a given setting voltage for performing setting operation is applied between the first and the second bit lines corresponding to the first memory element, and a given resetting voltage for performing resetting operation is applied between the first and the second bit lines corresponding to the second memory element, and thereby the setting operation to change resistance state from high resistance state to low resistance state is performed for the first memory element, and the resetting operation to change resistance state from the low resistance state to the high resistance state is performed for the second memory element.

In the second memory unit according to the embodiment of the present disclosure and the method of operating the second memory unit according to the embodiment of the present disclosure, a given electric potential is applied to the word line and the first and the second bit lines, and thereby resistance state of the memory element as the drive target is selectively changed between low resistance state and high resistance state. In the memory cell, the word line is connected to the gate of the transistor, the first bit line is connected to one of the source and the drain in the transistor with the resistance element in between, and the second bit line is connected to the other one of the source and the drain in the transistor with the memory element in between. In other words, in the memory cell, the section on the first bit line side (resistance element side) and the section on the second bit line side (resistance random access memory side) are symmetric to each other with respect to the transistor. Thereby, for example, in performing setting operation (operation to change resistance state from the high resistance state to the low resistance state) for the first memory element located on one word line and in performing resetting operation (operation to change resistance state from the low resistance state to the high resistance state) for the second memory element located on the one word line, a voltage applied to the foregoing one word line (word line electric potential) is able to be commoditized (is able to be commonly used) for the time of setting operation (on the first memory element side) and the time of resetting operation (on the second memory element side). In result, it becomes possible to execute setting operation and resetting operation at the same time (concurrently) for given (a plurality of) memory cells located on the same word line.

According to the first memory unit of the embodiment of the present disclosure and the method of operating the first memory unit of the embodiment of the present disclosure, in performing setting operation for the first memory element located on one word line and in performing resetting operation for the second memory element located on the one word line, a given word line electric potential is applied to the one word line, and the electric potential of the bit line on the lower electric potential side corresponding to the first memory element is set to the value higher than the value of the electric potential of the bit line on the lower electric potential side corresponding to the second memory element by an amount of the given electric potential difference. Thus, it becomes possible to execute setting operation and resetting operation at the same time (concurrently) for given (a plurality of) memory cells located on the same word line. Therefore, operation speed of the memory unit is able to be improved.

According to the second memory unit of the embodiment of the present disclosure and the method of operating the second memory unit of the embodiment of the present disclosure, in the memory cell, the word line is connected to the gate of the transistor, the first bit line is connected to one of the source and the drain in the transistor with the resistance element in between, and the second bit line is connected to the other one of the source and the drain in the transistor with the memory element in between. Thus, it becomes possible to execute setting operation and resetting operation at the same time (concurrently) for given (a plurality of) memory cells located on the same word line. Therefore, operation speed of the memory unit is able to be improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 8A and 8B are cross sectional views for explaining summary of setting operation and resetting operation in the memory element illustrated in FIG. 4.

DETAILED DESCRIPTION OF THE PREFERRED EMBODIMENTS

Embodiments of the present disclosure will be hereinafter described in detail with reference to the drawings. The description will be given in the following order.

1. First embodiment (an example in which a bit line electric potential corresponding to a memory element on setting operation side is set to a value higher than that of a bit line electric potential corresponding to a memory element on resetting operation)
2. Second embodiment (an example in which a resistance element indicating a fixed resistance value is provided on the side opposite to the memory element with respect to a selection transistor)
3. Modifications
Modifications 1 and 2 (Other configuration examples of the memory element)
Other modifications 1. First Embodiment Configuration of Memory Unit 1

Figure 1:
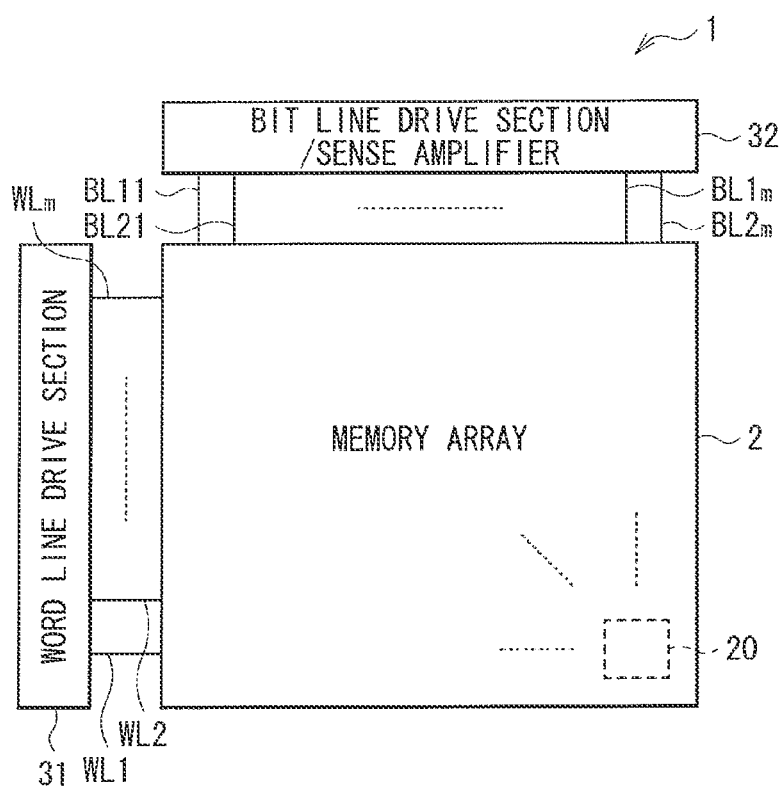
FIG. 1 is a block diagram illustrating a configuration example of a memory unit according to a first embodiment of the present disclosure.

FIG. 1 illustrates a block configuration of a memory unit (memory unit 1) according to a first embodiment of the present disclosure. The memory unit 1 includes a memory array 2 having a plurality of memory cells 20, a word line drive section 31, and a bit line drive section/sense amplifier 32. Of the foregoing elements, the word line drive section 31 and the bit line drive section/sense amplifier 32 correspond to a specific example of "drive section" in the present disclosure.

The word line drive section 31 applies a given electric potential (after-mentioned word line electric potential) to a plurality of (in this case, m pieces (m: an integer number equal to or greater than 2)) word lines WL1 to WLm arranged in parallel with each other (side by side) in the row direction.

The bit line drive section/sense amplifier 32 respectively applies a given electric potential to a plurality of (in this case, m pieces) bit lines BL11 to BL1m (first bit line) and a plurality of (in this case, m pieces) bit lines BL21 to BL2m (second bit line) arranged in parallel with each other (side by side) in the column direction. Thereby, a given voltage (after-mentioned setting voltage or after-mentioned resetting voltage) is respectively applied between the bit lines BL11 and BL21, between the bit lines BL12 and BL22, . . . and between the bit lines BL1m and BL2m. Further, the bit line drive section/sense amplifier 32 has a function to perform readout operation of information (data) from the respective memory cells 20 by using the foregoing m pieces of bit lines BL11 to BL1m and the foregoing m pieces of bit lines BL21 to BL2m, and a function to perform given signal amplification process in the internal sense amplifier. In the following description, the bit line BL1 is used as a collective term of the bit lines BL11 to BL1m and the bit line BL2 is used as a collective term of the bit lines BL21 to BL2m as appropriate.

As described above, the word line drive section 31 and the bit line drive section/sense amplifier 32 select one memory cell 20 as a drive target (operation target) from the plurality of memory cells 20 in the memory array 2, and selectively perform writing operation, erasing operation, or readout operation of information.

[Configuration of Memory Array 2]

Figure 2:
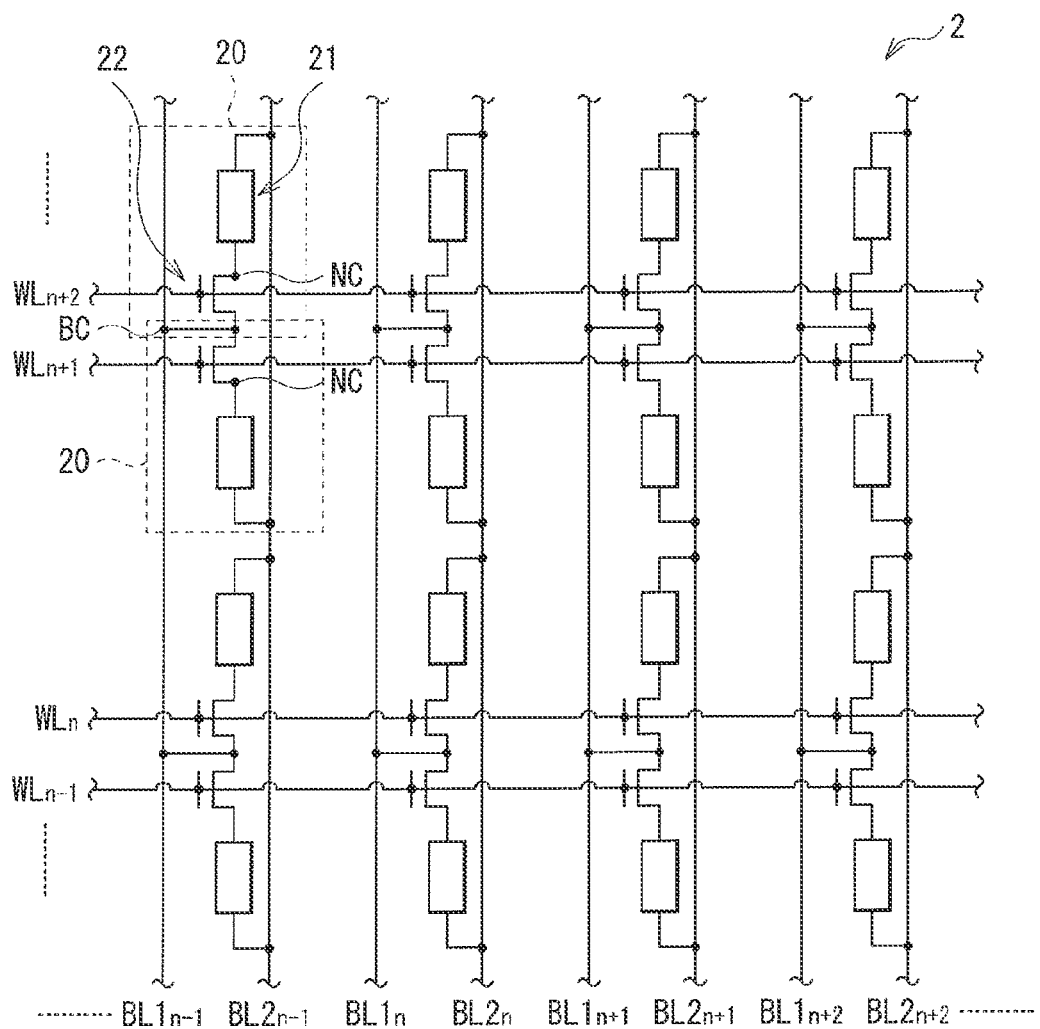
FIG. 2 is a circuit diagram illustrating a configuration example of a memory array illustrated in FIG. 1.

In the memory array 2, as illustrated in FIG. 1, the plurality of memory cells 20 are arranged in a row-column state (matrix state). FIG. 2 illustrates a circuit configuration example of the memory array 2. In the memory array 2, one word line WL and a pair of bit lines BL1 and BL2 are connected to the respective memory cells 20.

Figure 3:
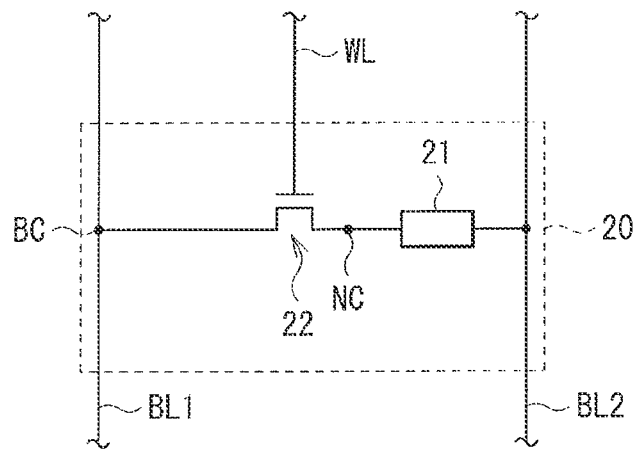
FIG. 3 is a circuit diagram illustrating a configuration example of a memory cell illustrated in FIG. 2.

Further, as illustrated in FIG. 2 and FIG. 3, the respective memory cells 20 have one memory element 21 and one selection transistor 22 (transistor), and have a so-called "1T1R" type circuit configuration (memory cell). In the memory cell 20, the word line WL is connected to a gate of the transistor 22, and the bit line BL1 is connected to one of a source and a drain in the transistor 22 with a bit contact BC in between. The bit line BL2 is connected to the other one (node contact NC side) of the source and the drain in the transistor 22 with the memory element 21 in between. Further, as illustrated in FIG. 2, the bit contact BC is commoditized (commonly used) for the upper and the lower memory cells 20 along the bit line BL1 direction. Thereby, the area of the memory array 2 is saved. However, the configuration is not limited to the foregoing description, and the bit contact BC may be provided for every memory cell 20 separately.

The selection transistor 22 is a transistor for selecting one memory element 21 as a drive target, and is composed of, for example, an MOS (Metal Oxide Semiconductor) transistor. However, the selection transistor 22 is not limited thereto, and a transistor having other structure may be used.

(Memory Element 21)

Figure 4:
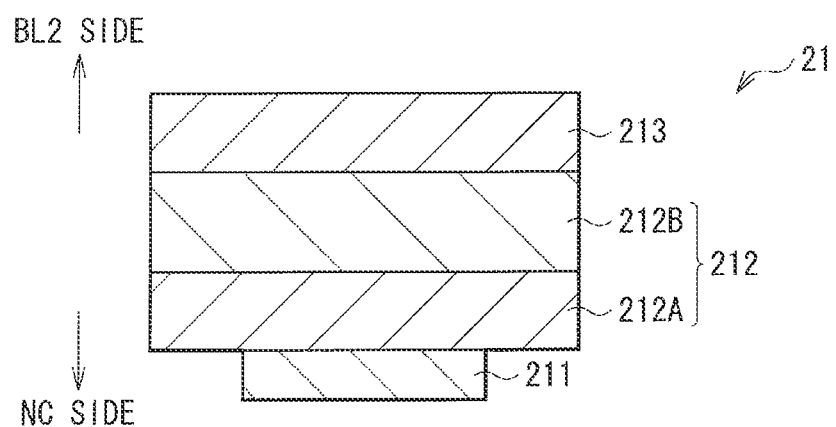
FIG. 4 is a cross sectional view illustrating a configuration example of a memory element illustrated in FIG. 2.

The memory element 21 is an element that performs storing (writing and erasing) of information (data) by using a fact that resistance state is reversibly changed (changed between low resistance state and high resistance state) according to polarity of an applied voltage. As illustrated in the cross sectional view of FIG. 4, the memory element 21 has a lower electrode 211 (first electrode), a memory layer 212, and an upper electrode 213 (second electrode) in this order.

The lower electrode 211 is an electrode provided on the transistor 22 side (node contact NC side). The lower electrode 211 is made of a wiring material used for semiconductor process, for example, a metal material or a metal nitride such as W (tungsten), WN (tungsten nitride), titanium nitride (TiN), and tantalum nitride (TaN). However, a material of the lower electrode 211 is not limited thereto.

The memory layer 212 has a laminated structure having an ion source layer 212B provided on the upper electrode 213 side and a resistance change layer 212A provided on the lower electrode 211 side. Though described in detail later, in the memory layer 212, resistance state is reversibly changed (changed between low resistance state and high resistance state) according to polarity of a voltage applied between the lower electrode 211 and the upper electrode 213.

The ion source layer 212B contains at least one chalcogen element out of tellurium (Te), sulfur (S), and selenium (Se) as an ion conductive material becoming anions. Further, the ion source layer 212B contains zirconium (Zr), hafnium (Hf) and/or copper (Cu) as a metal element capable of becoming cations, and further contains aluminum (Al) and/or germanium (Ge) as an element that forms an oxide at the time of erasing information. Specifically, the ion source layer 212B is made of an ion source layer material having composition such as ZrTeAl, ZrTeAlGe, CuZrTeAl, CuTeGe, and CuSiGe. The ion source layer 212B may contain an element other than the foregoing elements such as silicon (Si) and boron (B).

The resistance change layer 212A has a function to stabilize information retention characteristics as an electric conduction barrier, and is made of a material having a resistance value higher than that of the ion source layer 212B. Preferable examples of a material of the resistance change layer 212A include a rare earth element such as Gd (gadolinium) and an oxide or a nitride containing at least one of Al, Mg (magnesium), Ta, Si (silicon), and Cu.

The upper electrode 213 is made of a known semiconductor wiring material similar to that of the lower electrode 211. Specially, a stable material that does not react with the ion source layer 212B even after post annealing is preferable.

Figure 5:
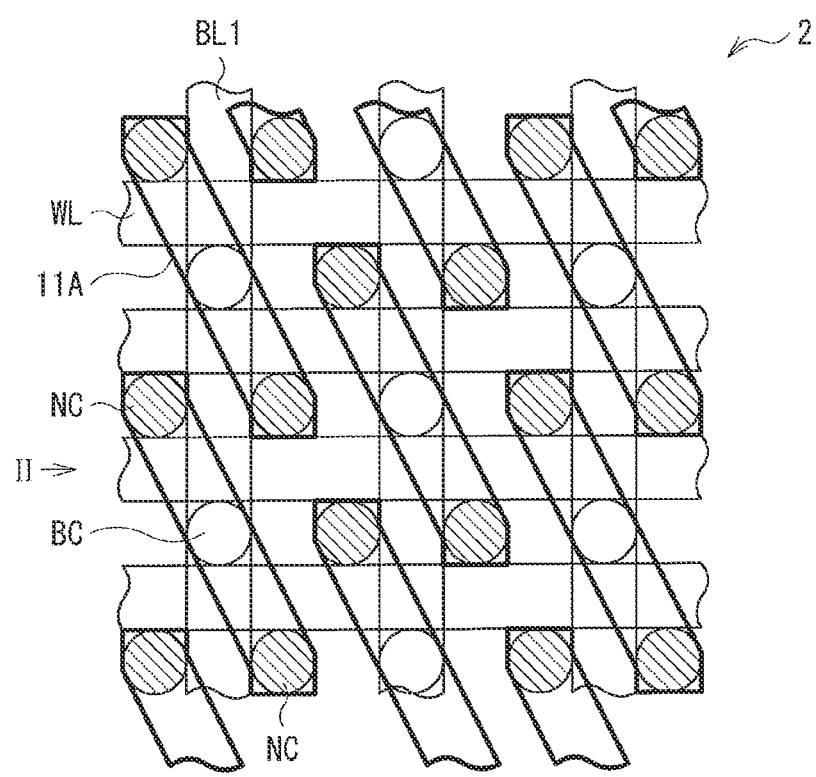
FIG. 5 is a plane view illustrating a configuration example of the memory array illustrated in FIG. 2.
Figure 6:
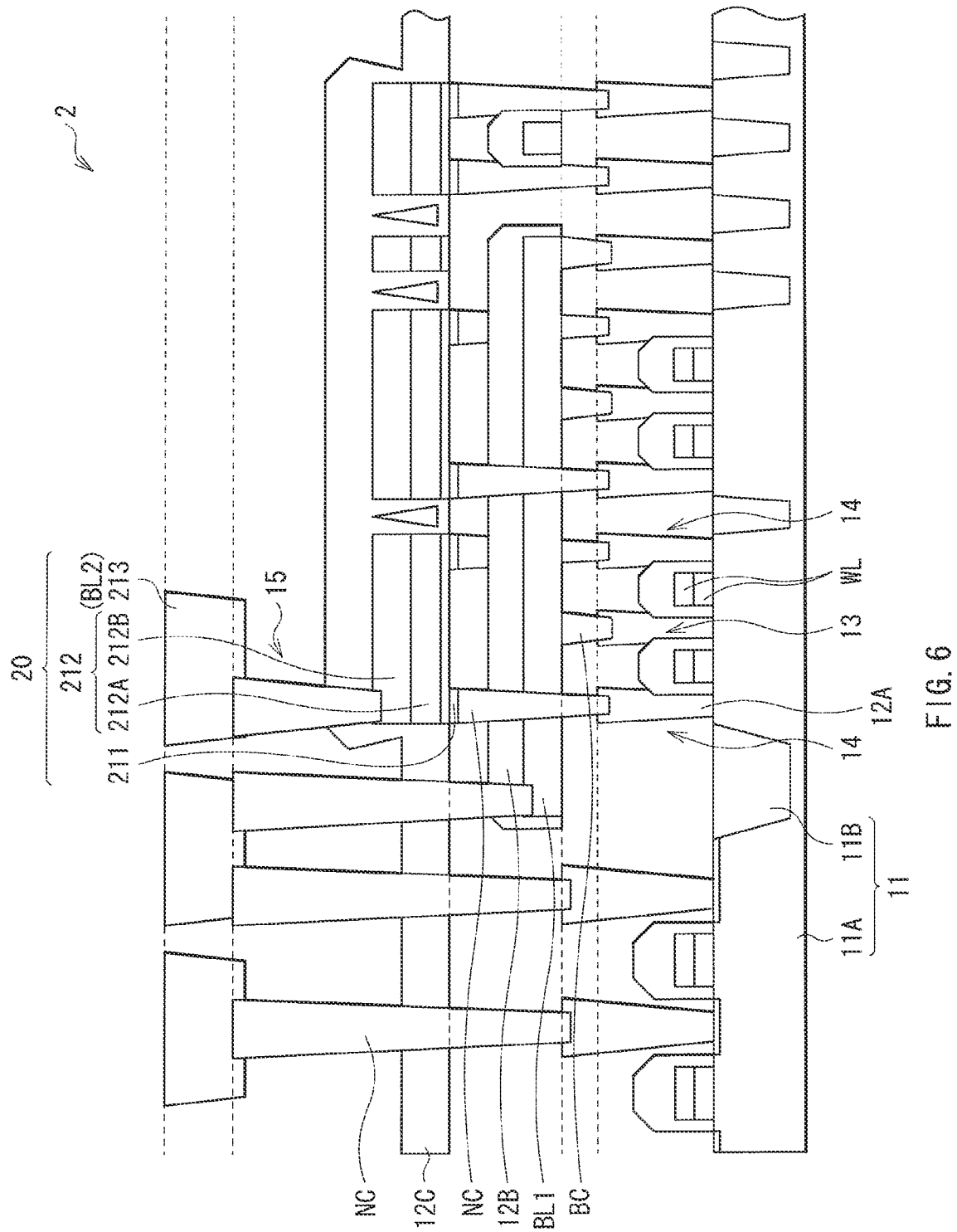
FIG. 6 is a side face view illustrating a configuration example of the memory array illustrated in FIG. 5, viewed from II direction.

The memory array 2 configured by using the foregoing memory element 21 has a planar configuration as illustrated in FIG. 5, for example. Further, in the case where the memory array 2 is viewed from II direction in FIG. 5, for example, the memory array 2 has side face configuration as illustrated in FIG. 6.

In other words, the memory array 2 has the plurality of parallel word lines WL, the plurality of parallel bit lines BL1, and the plurality of parallel bit lines BL2 on a substrate 11, for example. The substrate 11 is composed of, for example, a silicon (Si) substrate. On the surface of the substrate, a diffusion layer (active region) 11A of the transistor (for example, the foregoing selection transistor 22) is provided. The diffusion layer 11A is separated by an element separation layer 11B. The word line WL also functions as the gate of the transistor, and is arranged on the substrate 11 in the horizontal direction in FIG. 5, for example. The top face and the side face of the word line WL are covered with an insulative layer 12A. The bit lines BL1 and BL2 are respectively provided in the direction perpendicular to the word line WL, for example, is provided in the vertical direction in FIG. 5. The top face and the side face of the bit line BL1 are covered with an insulative layer 12B.

The bit contact BC is provided between two adjacent word lines WL. In the bit contact BC, the bit line BL1 is connected to the diffusion layer 11A, and the bit contact BC also functions as one of the source and the drain of the transistor. A connection plug 13 is provided between the bit contact BC and the diffusion layer 11A.

The node contact NC is provided on the side opposite to the bit contact electrode BC with respect to the respective two adjacent word lines WL sandwiching the bit contact BC. In the node contact NC, the lower electrode 211 is connected to the diffusion layer 11A, and the node contact NC also functions as the other one of the source and the drain of the transistor. A connection plug 14 is provided between the node contact NC and the diffusion layer 11A. The bit contact BC is commoditized for two adjacent transistors, while the node contact NC is provided for each transistor individually.

The top face and the side face of the memory layer 212 in the foregoing memory element 20 are covered with an insulative layer 12C. Further, a connection plug 15 is provided between the ion source layer 212B of the memory layer and the upper electrode 213. The upper electrode 213 in the memory element 20 also functions as part of the foregoing bit line BL2.

[Action And Effect of Memory Unit 1]

1. Basic Operation

In the memory unit 1, as illustrated in FIG. 1 and FIG. 2, the word line drive section 31 applies a given electric potential (after-mentioned word line electric potential) to the m pieces of word lines WL1 to WLm. In addition, the bit line drive section/sense amplifier 32 applies a given electric potential respectively to the m pieces of bit lines BL11 to BL1m and the m pieces of bit lines BL21 to BL2m. In other words, a given voltage (after-mentioned setting voltage or after-mentioned resetting voltage) is respectively applied between the bit lines BL11 and BL21, between the bit lines BL12 and BL22, . . . and between the bit lines BL1m and BL2m. Thereby, one memory cell 20 as a drive target (operation target) is selected from the plurality of memory cells 20 in the memory array 2, and writing operation, erasing operation, or readout operation of information is selectively performed.

Specifically, in the memory element 21 in the respective memory cells 20, resistance state of the memory layer 212 is reversibly changed (changed between low resistance state and high resistance state) according to polarity of a voltage applied between the lower electrode 211 and the upper electrode 213. By using such a fact, in the memory element 21, readout operation or erasing operation of information is performed.

Meanwhile, the bit line drive section/sense amplifier 32 performs readout operation of information from the memory element 21 in the memory cell 20 as the drive target (operation target) by using the m pieces of bit lines BL11 to BL1*m* and the m pieces of bit lines BL21 to BL2*m*, and performs given signal amplification process in the internal sense amplifier. Thereby, readout operation of information from the memory element 21 is performed.

In selecting the memory cell 20 (memory element 21) as the drive target (operation target), a given electric potential (word line electric potential) is applied to the word line WL connected to the memory cell 20, and a given electric potential (setting voltage or resetting voltage) is applied between the connected bit lines BL1 and BL2. Meanwhile, memory cells 20 other than the memory cell 20 as the drive target (operation target), a ground electric potential (for example, 0 V) is applied to the connected word line WL, and the connected bit lines BL1 and BL2 are respectively set to floating state or ground electric potential (0 V).

A description will be given in detail of setting operation and resetting operation corresponding to writing operation or erasing operation of information with reference to FIG. 7A to FIG. 8B. Setting operation is operation to change resistance state of the memory element 21 (specifically, the memory layer 212) from high resistance state (initial state) to low resistance state (operation to decrease resistance of the memory element 21). Further, on the other hand, resetting operation is operation to change resistance state of the memory element 21 (memory layer 212) from low resistance state to high resistance state (operation to increase resistance of the memory element 21).

Figure 7A:
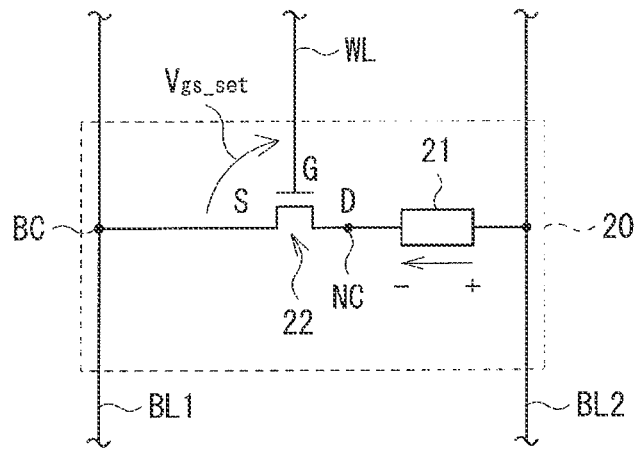
FIGS. 7A and 7B are circuit diagrams for explaining summary of setting operation and resetting operation in the memory cell illustrated in FIG. 3.

Specifically, at the time of setting operation illustrated in FIG. 7A, in the memory cell 20 as the drive target, a given word line electric potential is applied to the word line WL (gate of the selection transistor 22). In addition, a given setting voltage is applied between the bit lines BL1 and BL2 by using the electric potential of the bit line BL1 on the low potential side out of the bit lines BL1 and BL2 (in this case, the source side of the selection transistor 22) as a standard. Subsequently, as illustrated in FIG. 7A and FIG. 8A, in the memory element 21 as the drive target, a negative electric potential is applied to the lower electrode 211 side, and a positive electric potential is applied to the upper electrode 213 side respectively (that is, a positive voltage is applied to the memory element 21). Thereby, in the memory layer 212, cations such as Cu and/or Zr, Al are ion-conducted from the ion source layer 212B, are bonded with electrons on the lower electrode 211 side, and are precipitated. In result, a conductive path (filament) of low resistance Zr and/or Cu, Al or the like that is reduced to metal state is formed in the interface between the lower electrode 211 and the resistance change layer 212A. Otherwise, a conductive path is formed in the resistance change layer 212A. Thus, a resistance value of the resistance change layer 212A is decreased (resistance is lowered), and resistance state is changed from high resistance state as initial state to low resistance state. Accordingly, setting operation is performed in the memory element 21 as the drive target. After that, even if the positive voltage is removed and the voltage applied to the memory element 21 is eliminated, the low resistance state is retained. Thereby, information is written in the memory element 21.

Figure 7B:
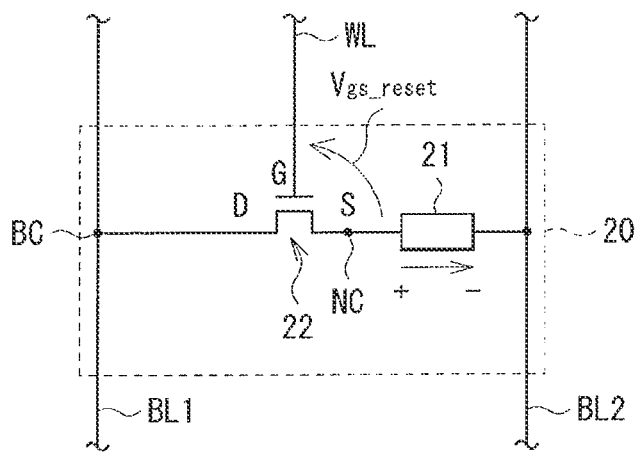

Meanwhile, at the time of resetting operation illustrated in FIG. 7B, in the memory cell 20 as the drive target, a given word line electric potential is applied to the word line WL (gate of the selection transistor 22). In addition, a given resetting voltage is applied between the bit lines BL1 and BL2 by using the electric potential of the bit line BL2 on the low potential side out of the bit lines BL1 and BL2 (in this case, the source side of the selection transistor 22) as a standard. Subsequently, as illustrated in FIG. 7B and FIG. 8B, in the memory element 21 as the drive target, a positive electric potential is applied to the lower electrode 211 side, and a negative electric potential is applied to the upper electrode 213 side (that is, a negative voltage is applied to the memory element 21). Thereby, Zr and/or Cu, Al of the conductive path formed in the resistance change layer 212 by the foregoing setting operation is oxidized and ionized, then, is dissolved in the ion source layer 212B or is bonded with Te or the like, and in result, a compound such as $Cu_2Te$ and CuTe is formed. Subsequently, the conductive path of Zr and/or Cu is eliminated or decreased, and the resistance value is increased (resistance is increased). Otherwise, further, additive elements such as Al and Ge existing in the ion source layer 212B form an oxidized film on the anode, and resistance state is changed to high resistance. Accordingly, resistance state is changed from low resistance state to high resistance state as initial state, and resetting operation is performed in the memory element 21 as the drive target. After that, even if the negative voltage is removed and the voltage applied to the memory element 21 is eliminated, the high resistance state is retained. Thereby, information written in the memory element 21 is able to be erased.

Figure 9:
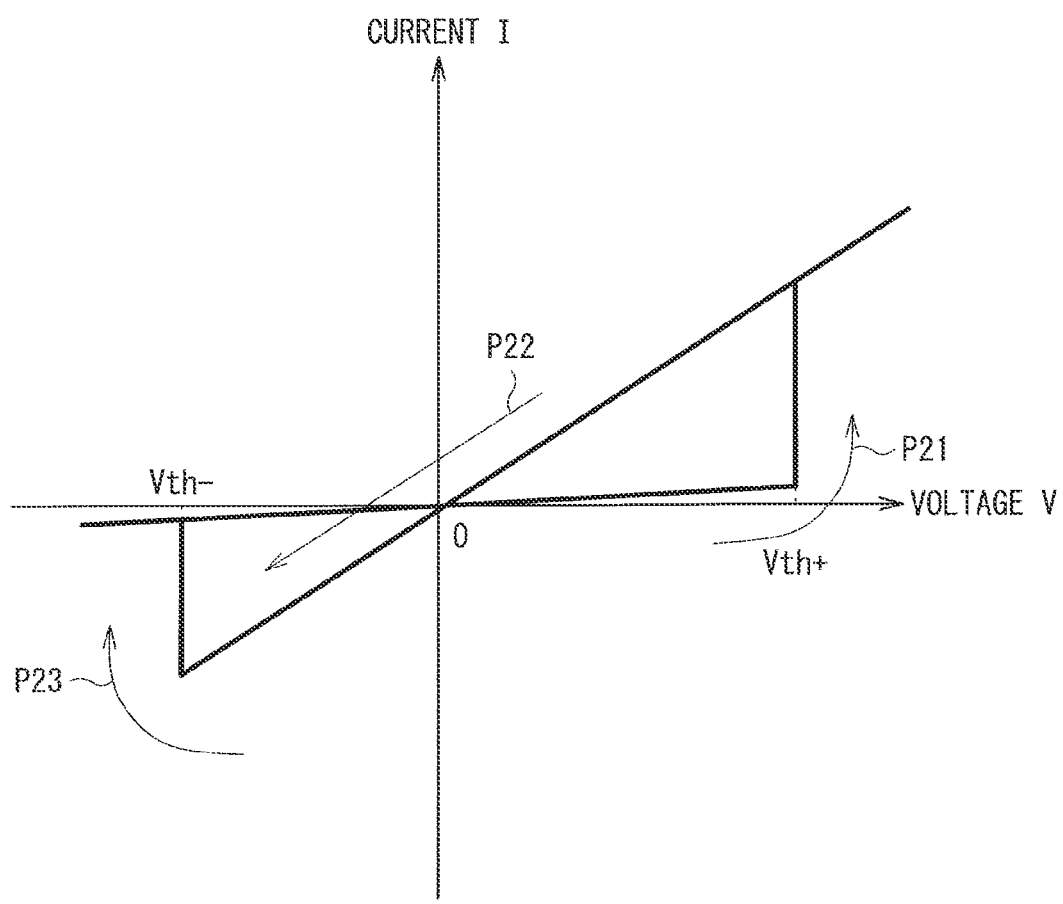
FIG. 9 is a characteristics diagram illustrating an example of current-voltage characteristics in the memory element illustrated in FIG. 4.

By repeating the foregoing steps (setting operation and resetting operation) as described above, in the memory element 21, writing information and erasing the written information are able to be performed repeatedly. For example, FIG. 9 illustrates such a state more specifically. In FIG. 9, the horizontal axis indicates size and polarity of voltage V applied to the memory element 21, and the vertical axis indicates current I flown in the memory element 21 at that time. First, in the case where the memory element 21 is in high resistance state (initial state), even if a voltage is applied to the memory element 21, the current I is scarcely flown. Next, as indicated by arrow P21 in the figure, in the case where a positive voltage exceeding a given threshold Vth+ is applied to the memory element 21, the memory element 21 is shifted to state in which a current is drastically flown (low resistance state). Subsequently, as indicated by arrow P22 in the figure, even if the applied voltage V is returned to 0 V, the low resistance state is retained. After that, as indicated by arrow P23 in the figure, in the case where a negative voltage exceeding a given threshold voltage Vth− is applied to the memory element 21, the memory element 21 is shifted to state in which a current is not flown drastically (high resistance state). After that, even after the applied voltage V is returned to 0 V, such high resistance state is retained. Accordingly, it is found that by applying a voltage with different polarity to the memory element 21, the resistance value (resistance state) is changed reversibly.

Further, for example, in the case where the state in which the resistance value is high (high resistance state) corresponds to information "0," and the state in which the resistance value is low (low resistance state) corresponds to information "1," it is able to state that information "0" is changeable to information "1" in the course of recording information by application of a positive voltage, and information "1" is changeable to information "0" in the course of erasing information by application of a negative voltage.

It is a definition issue whether writing operation/erasing operation for the memory element 21 corresponds to decreasing resistance (change from high resistance state to low resistance state) or increasing resistance (change from low resistance state to high resistance state). In this specification, low resistance state is defined as writing state, and high resistance state is defined as erasing state.

2. Details of Setting Operation And Resetting Operation

Next, a description will be given in detail of setting operation and resetting operation in the memory unit 1 as one of the characteristics of the present disclosure by comparing to a comparative example with reference to FIG. 10A to FIG. 11.

2-1. Comparative Example

Figure 10A:
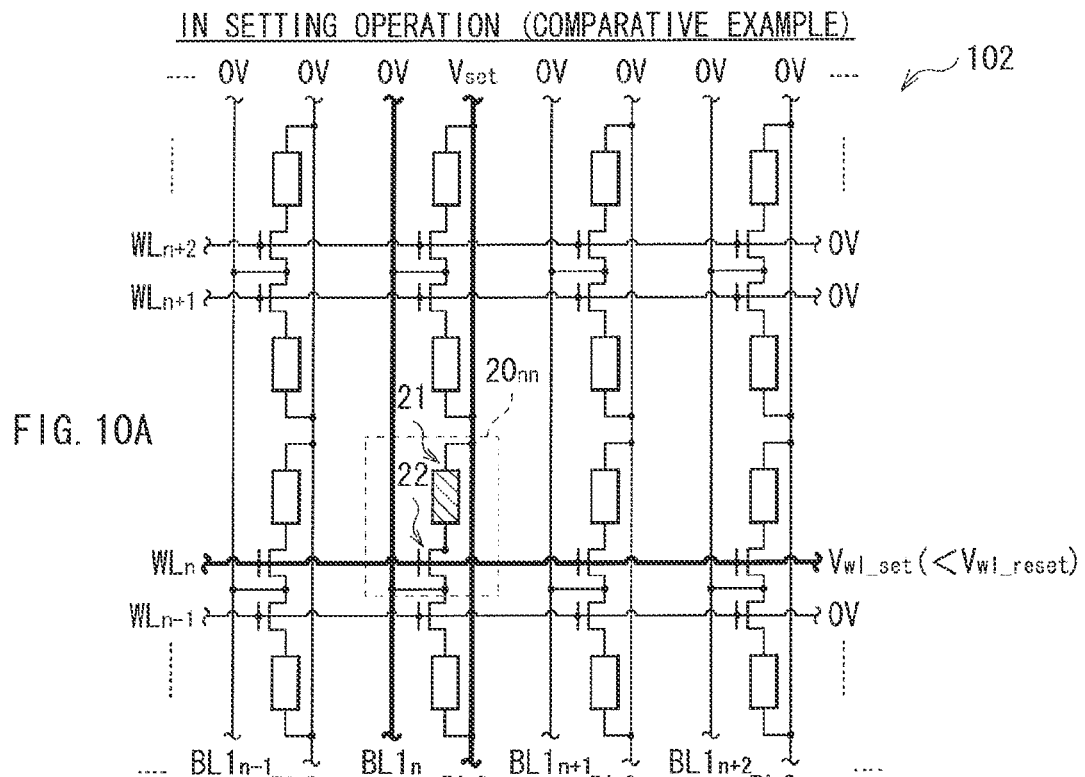
FIGS. 10A and 10B are circuit diagrams illustrating setting operation and resetting operation of a memory unit according to a comparative example.
Figure 10B:
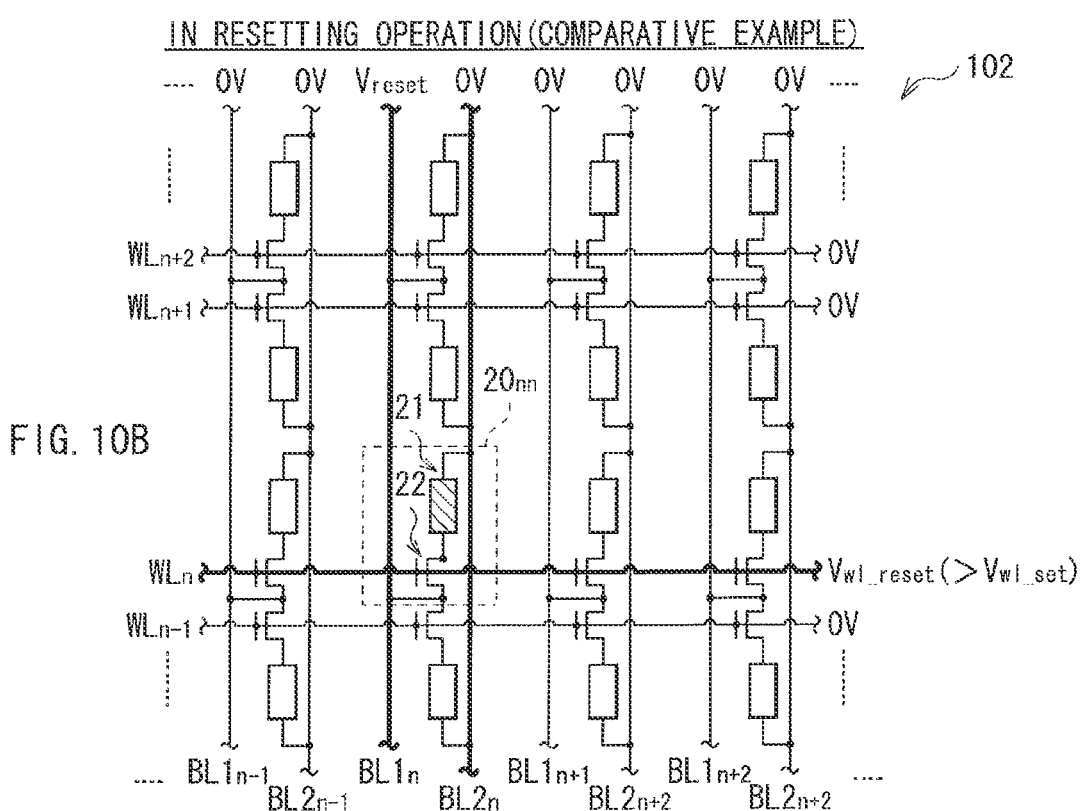

First, in a memory cell 102 in an existing memory unit according to the comparative example illustrated in FIGS. 10A and 10B, setting operation and resetting operation are performed in the memory element 21 (memory cell 20) as the drive target.

Specifically, for example, as illustrated in FIG. 10A, at the time of setting operation, word line electric potential Vw1_set for setting operation is applied to the word line WL (in this case, word line WLn) connected to the memory cell 20 as the drive target. Further, 0 V is applied to bit line BL1$n$ connected to the memory cell 20 as the drive target and a voltage (setting voltage Vset) for performing setting operation is applied to bit line BL2$n$, and thereby the setting voltage Vset is applied between the bit lines BL1$n$ and BL2$n$. Thereby, as illustrated in FIG. 7A, in the memory cell 20 as the drive target, gate-source voltage Vgs_set=Vw1_set is applied between the gate and the source of the selection transistor 22, a positive voltage is applied to the memory element 21, and the foregoing setting operation is performed.

Meanwhile, for example, as illustrated in FIG. 10B, at the time of resetting operation, word line electric potential Vw1_reset for resetting operation is applied to the word line WL (in this case, word line WLn) connected to the memory cell 20 as the drive target. Further, a voltage (resetting voltage Vreset) for performing resetting operation is applied to the bit line BL1$n$ connected to the memory cell 20 as the drive target and 0 V is applied to the bit line BL2$n$ respectively, and thereby the resetting voltage Vreset is applied between the bit lines BL1$n$ and BL2$n$. Thereby, as illustrated in FIG. 7B, in the memory cell 20 as the drive target, gate-source voltage Vgs_reset=(Vw1_reset−Vnc (electric potential of the node contact NC)) is applied between the gate and the source of the selection transistor 22, a negative voltage is applied to the memory element 21, and the foregoing resetting operation is performed.

It is found that for example, as illustrated in FIG. 9, in the memory element 21, in the case where a current at the same level as a current flown in setting operation is flown in the reverse direction, resetting operation is performed. In the comparative example, in the case where a current at the same level in the reverse direction is tried to be flown at the time of setting operation and at the time of resetting operation, the following disadvantage is generated due to the circuit configuration of the memory cell 20.

In other words, first, as illustrated in FIG. 7A, the gate-source voltage Vgs_set at the time of setting operation corresponds to difference between an electric potential applied to the word line WL (word line electric potential Vw1_set) and an electric potential (0 V) applied to the bit line BL1. Meanwhile, as illustrated in FIG. 7B, the gate-source voltage Vgs_reset at the time of resetting operation corresponds to difference between an electric potential applied to the word line WL (word line electric potential Vw1_reset) and an electric potential in the node contact NC. In other words, while the source of the selection transistor 22 has 0 V (electric potential of the bit line BL1) at the time of setting operation, the source of the selection transistor 22 does not have 0 V (electric potential of the bit line BL2) at the time of resetting operation. Thus, in the case where a current at the same level in the reverse direction is tried to be flown to the memory element 21 (selection transistor 22) at the time of setting operation and at the time of resetting operation, the word line electric potential Vw1_set is naturally set to be smaller than the word line electric potential Vw1_reset. In other words, a value of a voltage (word line electric potential) applied to the gate (word line WL) of the selection transistor 22 at the time of setting operation is different from a value thereof at the time of resetting operation. Accordingly, in the memory unit of the comparative example, it is not possible to execute setting operation and resetting operation at the same time (concurrently) for given (a plurality of) memory cells 20 located on the same word line WL. In result, it is necessary to allocate a setting operation time period and a resetting operation time period separately on the same word line WL, resulting in difficulty to improve operation speed of the memory unit.

2-2. Example 1

Figure 11:
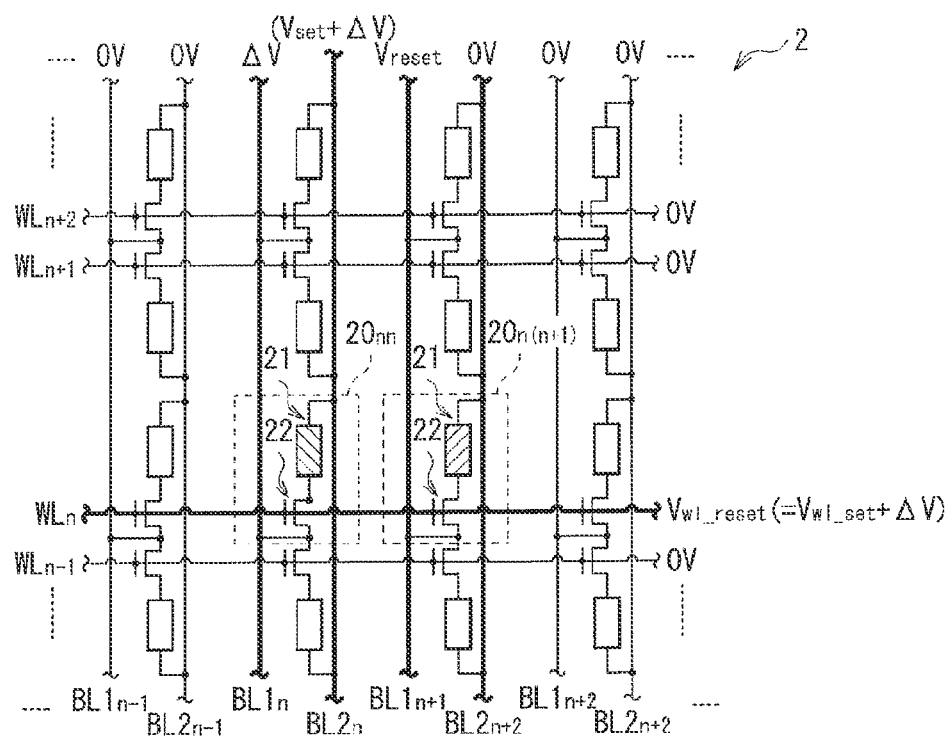
FIG. 11 is a circuit diagram illustrating setting operation and resetting operation according to an example (Example 1) of the first embodiment.

Meanwhile, in the memory unit 1 of this embodiment, the disadvantage in the foregoing comparative example (disadvantage of operation speed of the memory unit) is resolved by, for example, a method of the example illustrated in FIG. 11 (Example 1). In other words, it becomes possible to execute setting operation and resetting operation at the same time (concurrently) for a plurality of (in this case, two) memory cells 20 located on the same word line WL by the following method. A description will be given in detail of setting operation and resetting operation in this embodiment. In Example 1, setting operation is performed for memory cell 20$nn$ (first memory element) located on the word line WLn, and resetting operation is performed for memory cell 20$n$(n+1) (second memory element) located on the same word line WLn.

First, in Example 1, the word line electric potential Vw1_reset for resetting operation in the foregoing comparative example is applied to the word line WLn to which the memory cell 20$nn$ as a setting operation target and the memory cell 20$n$(n+1) as a resetting operation target are commonly connected. In other words, as described above, word line electric potential Vw1_set<word line electric potential Vw1_reset is established. Thus, the word line electric potential Vw1_reset as the higher electric potential out of the two word line electric potentials is supplied commonly to the two memory cells 20$nn$ and 20$n$(n+1).

Further, the resetting voltage Vreset is applied to the bit line BL1(n+1) connected to the memory cell 20$n$ (n+1) and 0 V is applied to the bit line BL2(n+1), and thereby the resetting voltage Vreset is applied between the bit lines BL1(n+1) and BL2(n+1). Thereby, as in the foregoing comparative example, in the memory cell 20$n$(n+1) as the resetting operation target, the gate-source voltage Vgs_reset=Vw1_reset−Vnc is applied between the gate and the source of the selection transistor 22, a positive voltage is applied to the memory element 21, and the foregoing resetting operation is performed.

Meanwhile, the following electric potentials are respectively applied to the bit lines BL1$n$ and BL2$n$ connected to the memory cell 20$nn$ as the setting operation target. In other words, where electric potential difference obtained by subtracting the word line electric potential Vw1_set for setting operation from the word line electric potential Vw1_reset for resetting operation is electric potential difference Δ (=Vw1_reset−Vw1_set), an electric potential for the amount of electric potential difference ΔV is applied to the bit line BL1$n$, and (Vset+ΔV) is applied to the bit line BL2$n$ respectively. In other words, setting is made so that the electric potential (=ΔV) of the bit line BL1$n$ on the lower electric potential side out of the bit lines BL1$n$ and BL2$n$ connected to the memory cell 20$nn$ is higher, by the foregoing electric potential difference ΔV, than the electric potential (−0V) of the bit line BL2(n+1) on the lower electric potential side out of the bit lines BL1(n+1) and BL2(n+1) connected to the memory cell 20$n$(n+1). Specifically, setting is made so that the electric potential of the word line WLn is higher than the word line electric potential Vw1_set for setting operation by the electric potential difference ΔV. Accordingly, the electric potentials of the bit lines BL1$n$ and BL2$n$ are respectively set to values higher than the values at the time of setting operation of the foregoing comparative example by the amount of the electric potential difference ΔV. Thereby, as in the foregoing comparative example, the setting voltage Vset is applied between the bit lines BL1$n$ and BL2$n$. Further, as in the foregoing comparative example, in the memory cell 20$nn$ as the setting operation target, gate-source voltage Vgs_set (=Vw1_reset−ΔV) is applied between the gate and the source of the selection transistor 22, a positive voltage is applied to the memory element 21, and the foregoing setting operation is performed.

Accordingly, in this embodiment, the voltage applied to the same word line WL (word line electric potential Vw1_reset) is commoditized (commonly used) for the time of setting operation (in this case, on the memory cell 20$nn$ side) and the time of resetting operation (in this case, on the memory cell 20$n$(n+1) side). Thereby, unlike the comparative example, it becomes possible to execute setting operation and resetting operation at the same time (concurrently) for given (a plurality of) memory cells located on the same word line WL.

Accordingly, in this embodiment, in the case where setting operation is performed for the memory element 20 located on one word line WL and resetting operation is performed for the memory element 20 located on the foregoing one word line WL, given word line electric potential Vw1_reset is applied to the foregoing one word line, and the electric potential of the bit line BL1 on the lower electric potential side corresponding to the memory element 20 on setting operation side is set to a value higher than that of the electric potential of the bit line BL2 on the lower electric potential side corresponding to the memory element 20 on resetting operation side by the amount of given electric potential difference ΔV. Thus, it becomes possible to execute setting operation and resetting operation at the same time (concurrently) for given (a plurality of) memory cells located on the same word line WL. Therefore, in the memory unit 1 of this embodiment, compared to the memory unit of the foregoing comparative example, the operation speed is able to be more improved.

Further, as the circuit configuration itself of the memory cell 20 and the memory array 2, an existing circuit configuration is able to be used. Therefore, low cost is able to be realized (increase of development cost is able to be inhibited).

2. Second Embodiment

Subsequently, a description will be given of the second embodiment of the present disclosure. For the same elements as those in the foregoing first embodiment, the same referential symbols are affixed thereto, and descriptions thereof will be omitted as appropriate.

[Configuration of Memory Unit 1A]

Figure 12:
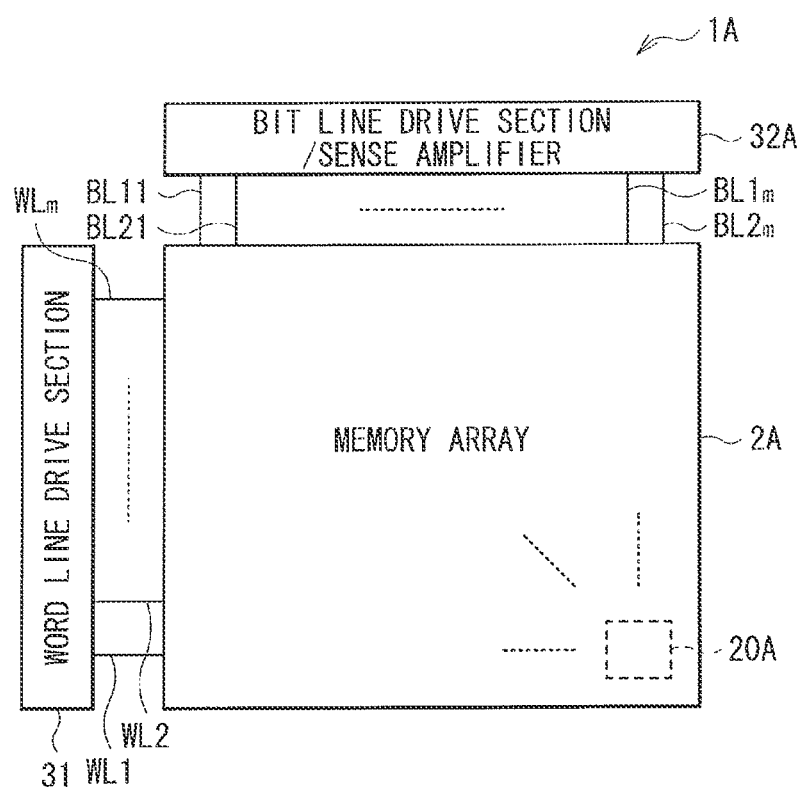
FIG. 12 is a block diagram illustrating a configuration example of a memory unit according to a second embodiment.

FIG. 12 illustrates a block configuration of the memory unit (memory unit 1A) according to the second embodiment. The memory unit 1A of this embodiment includes a memory array 2A having a plurality of memory cells 20A, the word line drive section 31, and a bit line drive section/sense amplifier 32A. The memory unit 1A has a structure similar to that of the memory unit 1 of the first embodiment, except that the memory array 2A is provided instead of the memory array 2, and the bit line drive section/sense amplifier 32A is provided instead of the bit line drive section/sense amplifier 32. Therefore, in this embodiment, the word line drive section 31 and the bit line drive section/sense amplifier 32A correspond to a specific example of "drive section" in the present disclosure.

Basic operation of the bit line drive section/sense amplifier 32A is similar to that of the bit line drive section/sense amplifier 32. However, an electric potential applied to the bit lines BL1 and BL2 in setting operation and resetting operation is different from that of the foregoing first embodiment. For details of the applied electric potential, a description will be given later.

[Configuration of Memory Array 2A]

Figure 13:
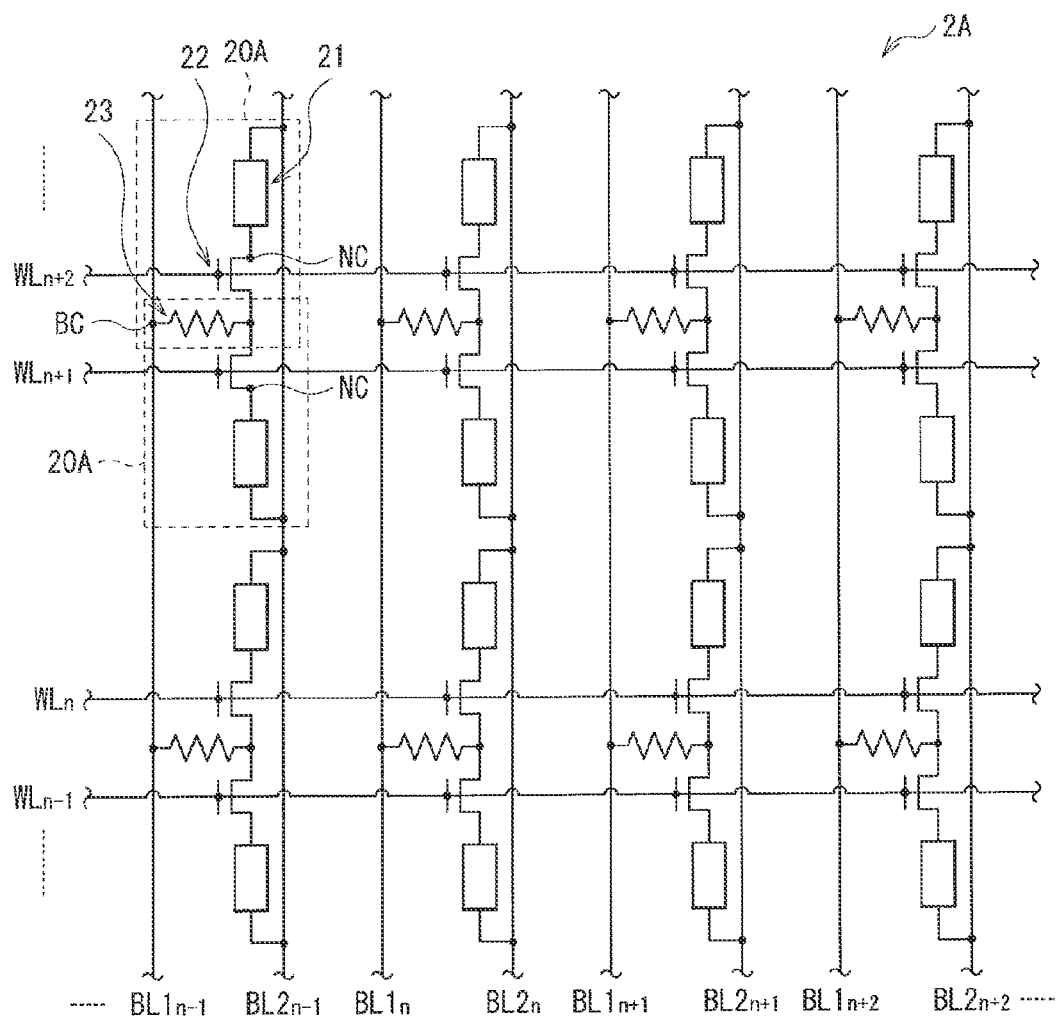
FIG. 13 is a circuit diagram illustrating a configuration example of a memory array illustrated in FIG. 12.

In the memory array 2A, as in the memory array 2, the plurality of memory cells 20A are arranged in a row-column state (matrix state). FIG. 13 illustrates a circuit configuration example of the memory array 2A. In the memory array 2A, as in the memory array 2, one word line WL and the pair of bit lines BL1 and BL2 are connected to the respective memory cells 20A. However, unlike the memory array 2, an aftermentioned plurality of fixed resistance elements 23 are arranged in the memory array 2A.

Figure 14:
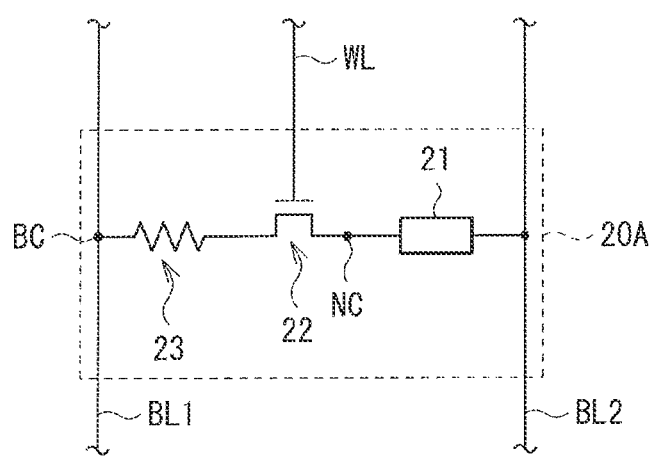
FIG. 14 is a circuit diagram illustrating a configuration example of a memory cell illustrated in FIG. 13.

Further, as illustrated in FIG. 13 and FIG. 14, as the memory cell 20 does, the respective memory cells 20A have one memory element 21 and one selection transistor 22 (transistor), and has a so-called "1T1R" type circuit configuration (memory cell). In the memory cell 20A, a circuit structure different from that of the memory cell 20 is adopted with regard to connection relation with the foregoing fixed resistance element 23. Specifically, in the memory cell 20A, the word line WL is connected to the gate in the transistor 22, and the bit line BL1 is connected to one of the source and the drain in the transistor 22 through the bit contact BC and the fixed resistance element 23 in between. The bit line BL2 is connected to the other one (node contact NC side) of the source and the drain in the transistor 22 through the memory element 21 in between. Further, as illustrated in FIG. 13, in addition to the bit contact BC, the fixed resistance element 23 is also commoditized (commonly used) for the upper and the lower memory cells 20 along the bit line BL1 direction. Thereby, the area of the memory array 2 is saved. However, the configuration is not limited to the foregoing description, and the bit contact BC and the fixed resistance element 23 may be respectively provided for every memory cell 20A separately.

The fixed resistance element 23 is a resistance element indicating a fixed resistance value. The fixed resistance value is, for example, approximately equal to (desirably equal to) a resistance value in low resistance state of the memory element 21 for the following reason. That is, as described above, in the memory element 21, a current flown at the time of setting operation is at the same level as a current flown at the time of resetting operation. As a specific value of the fixed resistance value, for example, about from 10 kΩ to 500 kΩ is desirable.

Figure 15:
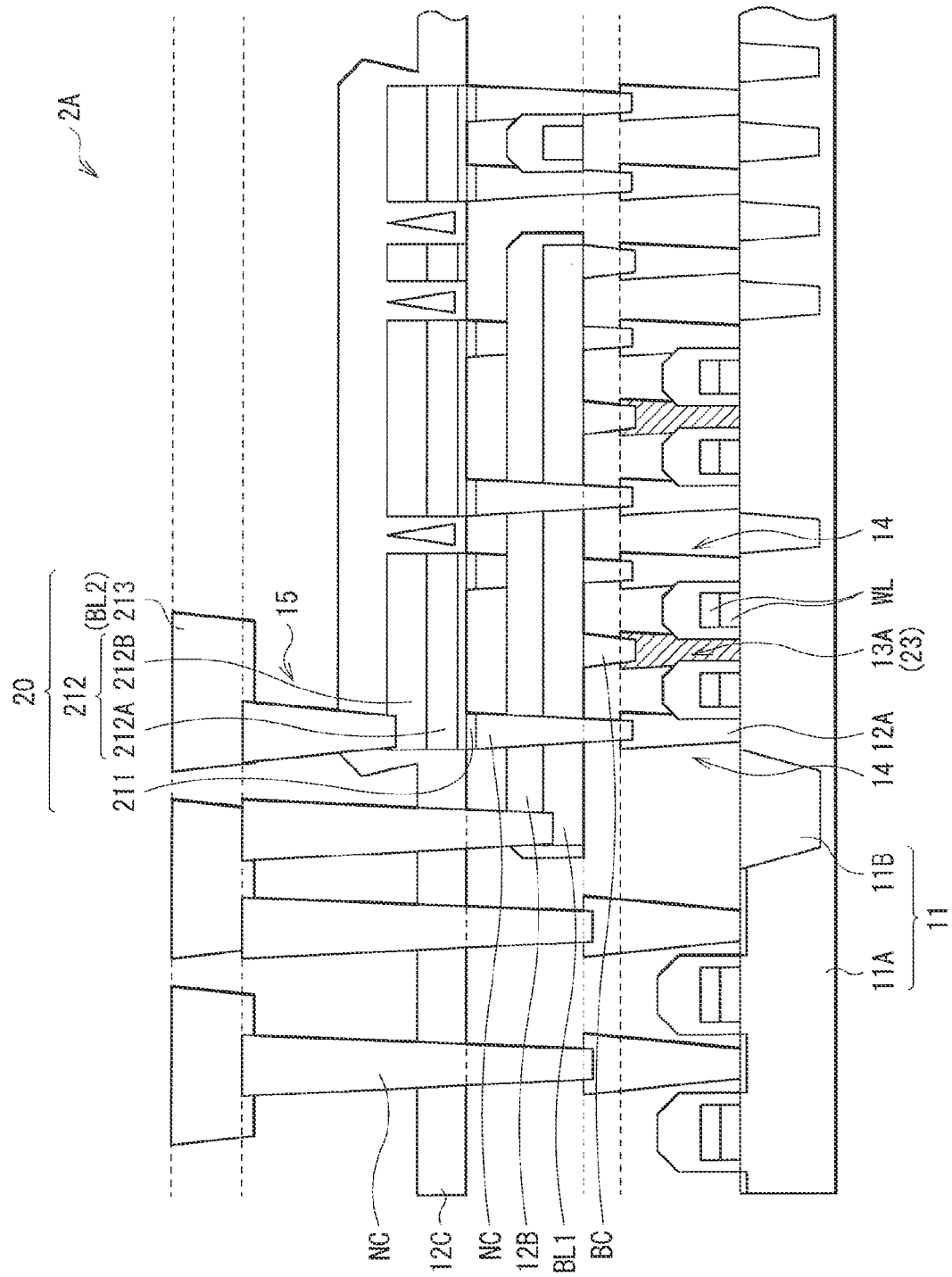
FIG. 15 is a side face view illustrating a configuration example of the memory array illustrated in FIG. 13.

The fixed resistance element 23 is formed in the following section with reference to the side face configuration of the memory array 2A illustrated in, for example, FIG. 15. That is, the fixed resistance element 23 is formed in a connection plug 13A as a connection section between the bit line BL1 and one of the source and the drain in the transistor (selection transistor 22). Specifically, the connection plug 13A is made of crystalline semiconductor (for example, crystalline silicon (polysilicon)) or amorphous (noncrystalline) semiconductor (for example, amorphous silicon). In addition, the resistance value of the fixed resistance element 23 is adjusted by concentration of impurity (for example, phosphorus (P)) of the crystalline semiconductor or the amorphous semiconductor. Meanwhile, the connection plug 14 composing the node contact NC is made of a metal such as tungsten (W).

[Action and Effect of Memory Unit 1A]

In the memory unit 1A, writing operation, erasing operation, and readout operation of information (data) are basically performed as in the memory unit 1 of the foregoing first embodiment. However, in the memory unit 1A of this embodiment, it is possible to execute setting operation and resetting operation at the same time (concurrently) for given (a plurality of) memory cells located on the same word line WL by using a method different from the method in the memory unit 1. A description will be hereinafter given in detail of such a method. In Example 2 described below, as in the foregoing Example 1, setting operation is performed for memory cell 20Ann located on the word line WLn, and resetting operation is performed for memory cell 20An(n+1) located on the same word line WLn.

Figure 16:
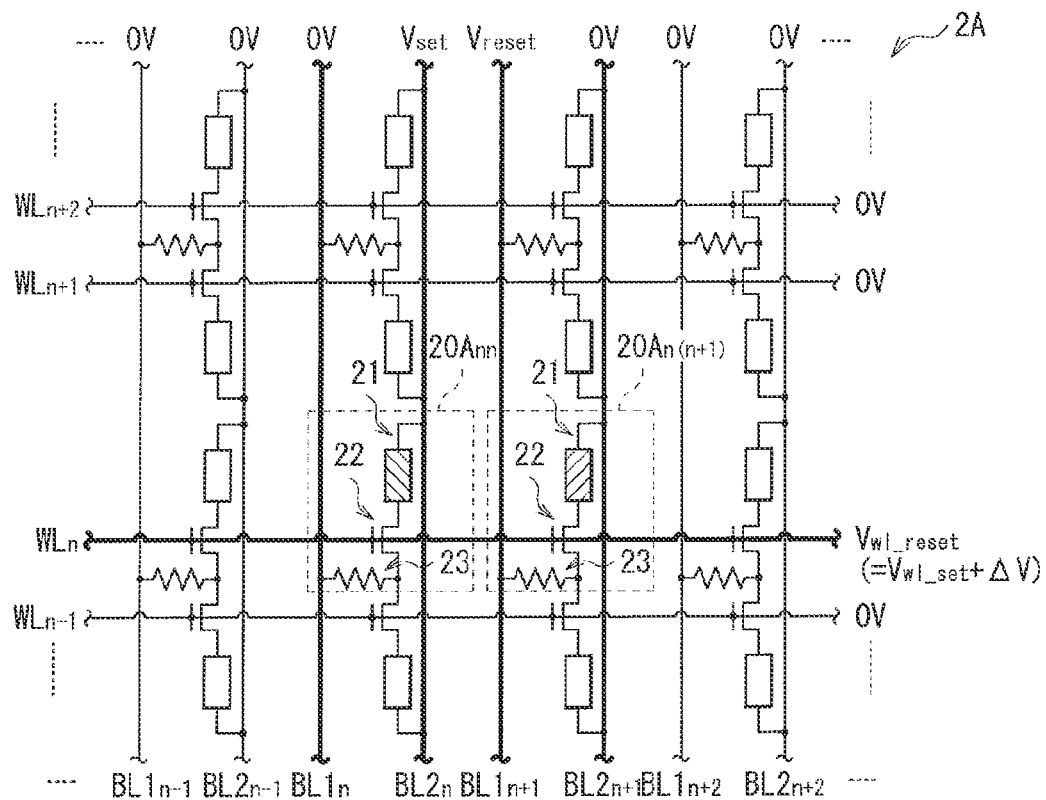
FIG. 16 is a circuit diagram illustrating setting operation and resetting operation according to an example (Example 2) of the second embodiment.
Figure 17A:
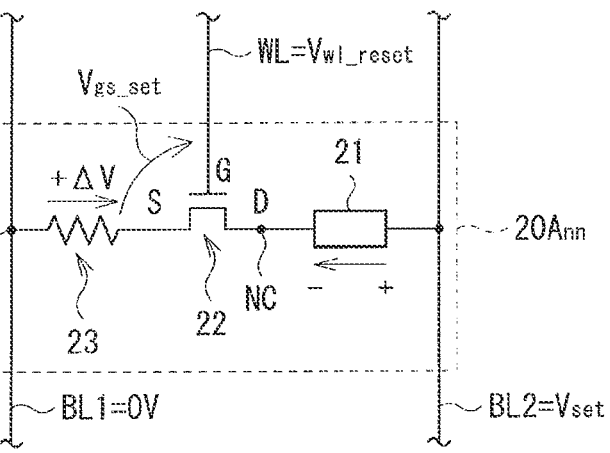
FIGS. 17A and 17B are circuit diagrams for explaining the setting operation and the resetting operation illustrated in FIG. 16 in detail in the memory cell.
Figure 17B:
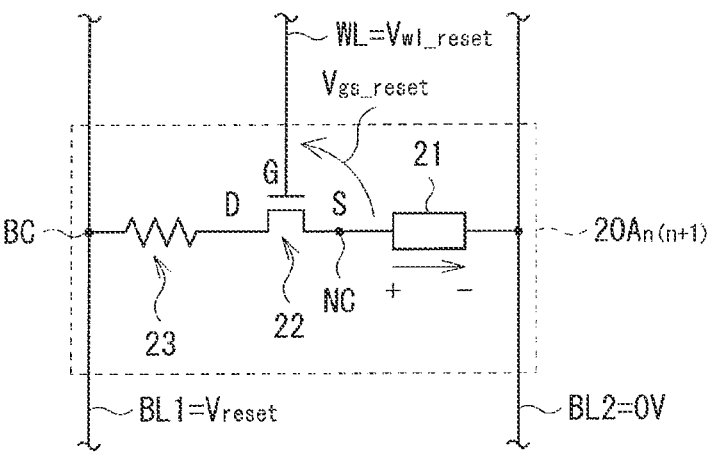

First, in an example of this embodiment (Example 2) illustrated in FIG. 16 to FIG. 17B, the word line electric potential Vw1_reset for resetting operation is applied to the word line WLn to which the memory cell 20Ann as a setting operation target and the memory cell 20An(n+1) as a resetting operation target are commonly connected respectively as in the foregoing Example 1.

Further, as in the foregoing Example 1, the resetting voltage Vreset is applied to the bit line BL1(n+1) connected to the memory cell 20An(n+1) and 0 V is applied to the bit line BL2(n+1), and thereby the resetting voltage Vreset is applied between the bit lines BL1(n+1) and BL2(n+1). Thereby, as in the foregoing Example 1, as illustrated in FIG. 17B, in the memory cell 20An(n+1) as a resetting operation target, the gate-source voltage Vgs_reset=Vw1_reset−Vnc is applied between the gate and the source of the selection transistor 22, a positive voltage is applied to the memory element 21, and the foregoing resetting operation is performed.

Meanwhile, unlike the foregoing Example 1, the following electric potentials are respectively applied to the bit lines BL1n and BL2n connected to the memory cell 20Ann as a setting operation target. That is, as in the foregoing comparative example, 0 V is applied to the bit line BL1n and the setting voltage Vset is applied to the bit line BL2n respectively. In other words, setting is made so that the electric potential (=0V) of the bit line BL1n on the lower electric potential side out of the bit lines BL1n and BL2n connected to the memory cell 20Ann is equal to electric potential (=0V) of the bit line BL2(n+1) on the lower electric potential side out of the bit lines BL1(n+1) and BL2(n+1) connected to the memory cell 20An(n+1). Thereby, as in the foregoing comparative example and Example 1, the setting voltage Vset is applied between the bit lines BL1n and BL2n.

However, in this embodiment, the foregoing fixed resistance element 23 is provided in the memory array 2A. Specifically, in the memory cell 20A, the section on the bit line BL1 side (fixed resistance element 23 side) and the section on the bit line BL2 side (memory element 21 side) are symmetric to each other with respect to the selection transistor 22. Thereby, in Example 2, in the memory cell 20Ann as a setting operation target, the following action occurs in setting operation. In other words, for example, as illustrated in FIG. 17A, the foregoing electric potential difference ΔV (=Vw1_reset−Vw1_set) is (automatically) generated between both ends of the fixed resistance element 23 (between the source of the selection transistor 22 and the bit contact BC). Thereby, as in the foregoing comparative example and Example 1, in the memory cell 20Ann as a setting operation target, the gate-source voltage Vgs_set (=Vw1_reset−ΔV) is applied between the gate and the source of the selection transistor 22, a positive voltage is applied to the memory element 21, and the foregoing setting operation is performed.

Effect of adding the fixed resistance element 23 on resetting operation is as follows. That is, for example, as illustrated in FIG. 17B, since the fixed resistance element 23 is connected to the drain side of the selection transistor 22 at the time of resetting operation, effect on the current flown at the time of resetting operation is small without limit.

Accordingly, in this embodiment, the voltage applied to the same word line WL (word line electric potential Vw1_reset) is commoditized (commonly used) for the time of setting operation (in this case, on the memory cell 20Ann side) and the time of resetting operation (in this case, on the memory cell 20An(n+1) side). Thereby, as in the foregoing first embodiment, it becomes possible to execute setting operation and resetting operation at the same time (concurrently) for given (a plurality of) memory cells located on the same word line WL.

Accordingly, in this embodiment, in the memory cell 20A, the word line WL is connected to the gate of the selection transistor 22, the bit line BL1 is connected to one of the source and the drain in the selection transistor 22 with the fixed resistance element 23 in between, and the bit line BL2 is connected to the other one of the source and the drain in the selection transistor 22 with the memory element 21 in between. Thus, it becomes possible to execute setting operation and resetting operation at the same time (concurrently) for given (a plurality of) memory cells located on the same word line WL. Therefore, in the memory unit 1 of this embodiment, compared to the memory unit of the foregoing comparative example, the operation speed is able to be more improved as well.

Modifications

Subsequently, a description will be given of modifications (modifications 1 and 2) common to the first and the second embodiments as described above. For the same elements as those in the foregoing embodiments, the same referential symbols are affixed thereto, and descriptions thereof will be omitted as appropriate.

Modification 1

Figure 18:
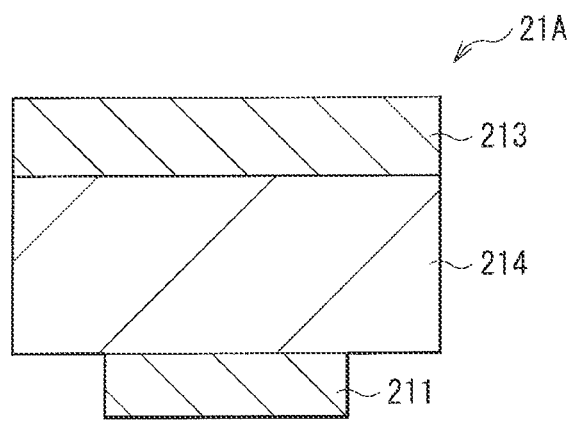
FIG. 18 is a cross sectional view illustrating a configuration example of a memory element according to Modification 1.

FIG. 18 illustrates a cross sectional structure of a memory element (memory element 21A) according to Modification 1. The memory element 21A of this modification is composed of a PCM (Phase Change Memory).

The memory element 21A has a memory layer 214 made of GeSbTe alloy such as $Ge_2Sb_2Te_5$ between the lower electrode 211 and the upper electrode 213. In the memory layer 214, phase change from/to crystalline state to/from noncrystalline state (amorphous state) is generated by application of a current. In association with the phase change, a resistance value (resistance state) is reversibly changed.

In the memory element 21A of this modification, in the case where a positive voltage or a negative voltage is applied between the lower electrode 211 and the upper electrode 213, the memory layer 214 is changed from high resistance amorphous state to low resistance crystalline state (or from low resistance crystalline state to high resistance amorphous state). By repeating such a process, in the memory element 21A, writing information and erasing written information are able to be performed repeatedly.

Modification 2

Figure 19:
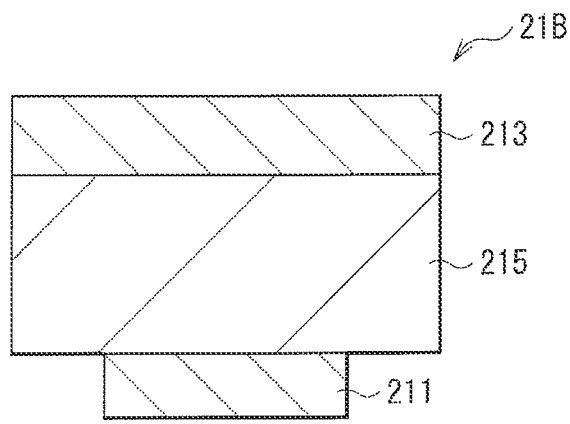
FIG. 19 is a cross sectional view illustrating a configuration example of a memory element according to Modification 2.

FIG. 19 illustrates a cross sectional structure of a memory element (memory element 21B) according to Modification 2. The memory element 21B of this modification is composed of a ReRam (Resistive Random Access Memory).

The memory element 21B has a memory layer 215 made of an oxide such as NiO, $TiO_2$, and $PrCaMnO_3$ between the lower electrode 211 and the upper electrode 213. A resistance value (resistance state) is reversibly changed by application of a voltage to the oxide.

In the memory element 21B of this modification, in the case where a positive voltage or a negative voltage is applied between the lower electrode 211 and the upper electrode 213, the memory layer 215 is changed from high resistance state to low resistance state (or from low resistance state to high resistance state). By repeating such a process, in the memory element 21B, writing information and erasing written information are able to be performed repeatedly.

Other Modifications

The present technology has been described with reference to the embodiments and the modifications. However, the present technology is not limited to the foregoing embodiments and the like, and various modifications may be made.

For example, materials and the like of each layer described in the foregoing embodiments and the like are not limited, and other materials may be used. Further, in the foregoing embodiments and the like, the structures of the memory elements 21, 21A, and 21B, the memory unit 1A and the like are described with specific examples. However, all layers are not necessarily provided, and other layer may be further included.

A memory element applied to the present disclosure is not limited to the memory elements 21, 21A, and 21B described in the foregoing embodiments and the like. A memory element having other configuration may be used as long as resistance state of such a memory element is reversibly changed according to polarity of an applied voltage. Specifically, a memory element such as MTJ (Magnetic Tunnel Junction) used for an MRAM (Magnetoresistive Random Access Memory) or the like and a resistance change element using a transition metal oxide or the like may be used.

The present disclosure contains subject matter related to that disclosed in Japanese Priority Patent Application JP 2011-004830 filed in the Japanese Patent Office on Jan. 13, 2011, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A memory unit comprising:
a plurality of memory cells that each have a memory element in which a resistance state is reversibly changed according to polarity of an applied voltage and a transistor for selecting the memory cell as a drive target;
a plurality of word lines and a plurality of first and second bit lines, each connected to one of the plurality of memory cells; and
a drive section that selects at least one of the plurality of memory cells as the drive target and selectively changes the resistance state of the memory element of the memory cell selected as the drive target between a low resistance state and a high resistance state by applying electric potentials to the word line and the first and the second bit lines connected to the memory cell selected as the drive target,
wherein the drive section performs a setting operation to change the resistance state from the high resistance state to the low resistance state for a first memory element located on one word line and a resetting operation to change the resistance state from the low resistance state to the high resistance state for a second memory element located on the one word line by:
applying a first potential $P_1$ to the one word line,
applying a second potential $P_2$ to the first bit line corresponding to the first memory element,
applying the first potential $P_1$ to the second bit line corresponding to the first memory element,
applying the first potential $P_1$ to the first bit line corresponding to the second memory element,
applying and a third potential $P_3$ to the second bit line corresponding to the second memory element,
wherein $P_1$, $P_2$, and $P_3$ are set such that:

$P_2=P_3+\Delta V$, and $P_1 \geq P_2$, where $\Delta V$ is a non-zero number.

2. The memory unit according to claim 1, wherein a value of $\Delta V$ equals a difference between a setting voltage for a performing a setting operation in the plurality of memory cells and a resetting voltage for performing resetting operation in the plurality of memory.

3. The memory unit according to claim 1, wherein in each of the plurality of memory cells:
the corresponding word line is connected to a gate of the transistor,
the corresponding first bit line is connected to one of a source and a drain in the transistor, and
the corresponding second bit line is connected to the other one of the source and the drain in the transistor with the memory element in between.

4. The memory unit according to claim 1, wherein the memory element has a first electrode, a memory layer, and a second electrode in this order, and
in the memory layer, resistance state is reversibly changed according to polarity of a voltage applied between the first electrode and the second electrode.

5. The memory unit according to claim 4, wherein the memory layer has a resistance change layer provided on the first electrode side and an ion source layer provided on the second electrode side.

6. The memory unit according to claim 5, wherein in the memory element, when a negative electric potential is applied to the first electrode side and a positive electric potential is applied to the second electrode side, ions in the ion source layer are moved to the first electrode side and resistance of the resistance change layer is decreased, and thereby the setting operation is performed, and when a positive electric potential is applied to the first electrode side and a negative electric potential is applied to the second electrode side, ions in the ion source layer are moved to the second electrode side and the resistance of the resistance change layer is increased, and thereby the resetting operation is performed.

7. A memory unit comprising:
a plurality of memory cells that respectively have a memory element in which resistance state is reversibly changed according to polarity of an applied voltage and a transistor for selecting a memory element as a drive target;
a plurality of word lines and a plurality of first and second bit lines connected to the plurality of memory cells; and
a drive section that selectively changes resistance state of the memory element as the drive target between low resistance state and high resistance state by applying a given electric potential to the word line and the first and the second bit lines,
wherein in performing setting operation to change resistance state from the high resistance state to the low resistance state for a first memory element located on one word line and in performing resetting operation to change resistance state from the low resistance state to the high resistance state for a second memory element located on the one word line, the drive section applies a given word line electric potential to the one word line, and sets an electric potential of a bit line on a lower electric potential side out of the first and the second bit lines corresponding to the first memory element to a value higher than a value of an electric potential of a bit line on the lower electric potential side corresponding to the second memory element by an amount of given electric potential difference,
wherein the drive section applies a given setting voltage for performing the setting operation between the first and the second bit lines corresponding to the first memory element, and applies a given resetting voltage for performing the resetting operation between the first and the second bit lines corresponding to the second memory element,
wherein the given electric potential difference is an electric potential difference obtained by subtracting a setting electric potential set in performing the setting operation for the memory element from a resetting electric potential set in performing the resetting operation for the memory element, and
wherein the given word line electric potential is the resetting electric potential.

8. A method of operating a memory unit that has a plurality of memory cells that each have a memory element in which a resistance state is reversibly changed according to a polarity of an applied voltage and a transistor for selecting the memory element as a drive target and a plurality of word lines and a plurality of first and second bit lines, each connected to one of the plurality of memory cells, the method comprising:
performing a setting operation for a first memory element connected to a first word line of the plurality of word lines and a resetting operation for a second memory element connected to the first word line by:
applying a first potential $P_1$ to the first word line,
applying a second potential $P_2$ to the first bit line corresponding to the first memory element,
applying the first potential $P_1$ to the second bit line corresponding to the first memory element,
applying the first potential $P_1$ to the first bit line corresponding to the second memory element,
applying and a third potential $P_3$ to the second bit line corresponding to the second memory element,
wherein $P_1$ $P_2$ and $P_3$ are set such that:

$$P_2=P_3+\Delta V, \text{ and}$$

$$P_1 \geq P_2,$$

where $\Delta V$ is a non-zero number.

9. A memory unit comprising:
a plurality of memory cells that respectively have a memory element in which resistance state is reversibly changed according to polarity of an applied voltage and a transistor for selecting a memory element as a drive target;
a plurality of resistance elements indicating a fixed resistance value;
a plurality of word lines and a plurality of first and second bit lines connected to the plurality of memory cells; and
a drive section that selectively changes resistance state of the memory element as the drive target between low resistance state and high resistance state by applying a given electric potential to the word line and the first and the second bit lines,
wherein in the memory cell, the word line is connected to a gate of the transistor,
the first bit line is connected to one of a source and a drain in the transistor with the resistance element in between, and
the second bit line is connected to the other one of the source and the drain in the transistor with the memory element in between.

10. The memory unit according to claim 9, wherein the resistance value of the resistance element is approximately equal to a resistance value in the low resistance state of the memory element.

11. The memory unit according to claim 9, wherein in performing setting operation to change resistance state from the high resistance state to the low resistance state for a first memory element located on one word line and in performing resetting operation to change resistance state from the low resistance state to the high resistance state for a second memory element located on the one word line,
a given word line electric potential is applied to the one word line,
while an electric potential of a bit line on a lower electric potential side out of the first and the second bit lines corresponding to the first memory element is set to a value equal to an electric potential of a bit line on the lower electric potential side corresponding to the second memory element,
a given setting voltage for performing the setting operation is applied between the first and the second bit lines corresponding to the first memory element, and a given resetting voltage for performing the resetting operation is applied between the first and the second bit lines corresponding to the second memory element.

12. The memory unit according to claim 11, wherein the given word line electric potential is a resetting electric potential set in performing the resetting operation for the memory element.

13. The memory unit according to claim 12, wherein in performing the setting operation for the first memory element, an electric potential difference obtained by subtracting a setting electric potential set in performing the setting operation for the memory element from the resetting electric potential is generated between both ends of the resistance element connected to the first memory element with the transistor in between.

14. The memory unit according to claim 9, wherein the resistance element is formed in a connection section between the first bit line and one of the source and the drain in the transistor.

15. The memory unit according to claim 14, wherein the connection section is composed of crystalline semiconductor or amorphous semiconductor, and
the resistance value of the resistance element is adjusted by impurity concentration in the crystalline semiconductor or the amorphous semiconductor.

16. The memory unit according to claim 9, wherein the resistance element is commoditized for two memory cells.

17. The memory unit according to claim 9, wherein the memory element has a first electrode, a memory layer, and a second electrode in this order, and
in the memory layer, resistance state is reversibly changed according to polarity of a voltage applied between the first electrode and the second electrode.

18. The memory unit according to claim 17, wherein the memory layer has a resistance change layer provided on the first electrode side and an ion source layer provided on the second electrode side.

19. A method of operating a memory unit, wherein in operating a memory unit that includes a plurality of memory cells respectively having a memory element in which resistance state is reversibly changed according to polarity of an applied voltage and a transistor for selecting a memory element as a drive target, a plurality of resistance elements indicating a fixed resistance value, and a plurality of word lines and a plurality of first and second bit lines connected to the plurality of memory cells, in which in the memory cell, the word line is connected to a gate of the transistor, the first bit line is connected to one of a source and a drain in the transistor with the resistance element in between, and the second bit line is connected to the other one of the source and the drain in the transistor with the memory element in between,
a given word line electric potential is applied to one word line,
while an electric potential of a bit line on a lower electric potential side out of the first and the second bit lines corresponding to a first memory element located on the one word line is set to a value equal to that of an electric potential of a bit line on the lower electric potential side corresponding to a second memory element located on the one word line, a given setting voltage for performing setting operation is applied between the first and the second bit lines corresponding to the first memory element, and a given resetting voltage for performing resetting operation is applied between the first and the second bit lines corresponding to the second memory element, and thereby
the setting operation to change resistance state from high resistance state to low resistance state is performed for the first memory element, and the resetting operation to change resistance state from the low resistance state to the high resistance state is performed for the second memory element.

20. A memory unit comprising:
memory cells that each include a memory element in which a resistance state is reversibly changed according to polarity of an applied voltage and a transistor for selecting the memory element as a drive target;
word lines, first bit lines, and second bit lines, each of the memory cells being connected to one of the word lines, one of the first bit lines, and one of the second bit lines; and
a drive section that selects at least one of the memory cells as the drive target and selectively changes the resistance state of the memory element of the memory cell selected as the drive target between a low resistance state and a high resistance state by applying electric potentials to the word line and the first and second bit lines connected to the memory cell selected as the drive target,
wherein the drive section performs a setting operation for a first memory element located on a first word line concurrently with performing a resetting operation for a second memory element located on the first word line by applying a first potential $P_1$ to the first word line, and while the first potential $P_1$ is applied to the first word line:
applying the first potential $P_1$ to the second bit line corresponding to the first memory element,
applying the first potential $P_1$ to the first bit line corresponding to the second memory element,
applying and a third potential $P_3$ to the second bit line corresponding to the second memory element,
wherein $P_1$, $P_2$, and $P_3$ are set such that:

$$P_2 = P_3 + \Delta V, \text{ and}$$

$$P_1 \geq P_2,$$

where $\Delta V$ is a non-zero number.

* * * * *